US012684968B2

(12) United States Patent
Lee et al.

(10) Patent No.: US 12,684,968 B2
(45) Date of Patent: Jul. 14, 2026

(54) ALIGNMENT PAD OF DISPLAY PANEL AND DISPLAY DEVICE HAVING THE SAME

(71) Applicant: Samsung Display Co., LTD., Yongin-si (KR)

(72) Inventors: Kyung-Mok Lee, Seoul (KR); Young Min Cho, Seongnam-si (KR); Hyunwoo Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 849 days.

(21) Appl. No.: 18/075,735

(22) Filed: Dec. 6, 2022

(65) Prior Publication Data

US 2023/0225162 A1 Jul. 13, 2023

(30) Foreign Application Priority Data

Jan. 11, 2022 (KR) ........................ 10-2022-0003992

(51) Int. Cl.
H10K 59/131 (2023.01)
G02F 1/1345 (2006.01)

(52) U.S. Cl.
CPC ....... H10K 59/131 (2023.02); G02F 1/13458 (2013.01); G09G 2290/00 (2013.01)

(58) Field of Classification Search
CPC .............. H10K 59/131; G02F 1/13458; G09G 2290/00
See application file for complete search history.

(56) References Cited

U.S. PATENT DOCUMENTS

2021/0173542 A1* 6/2021 Hinson ................. G06F 3/0488

FOREIGN PATENT DOCUMENTS

| CN | 107229374 A | * 10/2017 | ........... G06F 1/1626 |
| CN | 107658234 A | 2/2018 | |
| KR | 1020060035179 A | 4/2006 | |
| KR | 100683152 B1 | 2/2007 | |
| KR | 1020160091526 A | 8/2016 | |
| KR | 1020180015331 A | 2/2018 | |
| KR | 20210147734 A | * 12/2021 | ............. H01L 24/81 |

* cited by examiner

*Primary Examiner* — Lucy P Chien
(74) *Attorney, Agent, or Firm* — CANTOR COLBURN LLP

(57) ABSTRACT

A display device includes a display area and a non-display area including a first driving pad portion at which a display panel is connected to an integrated circuit chip by a solder bump having a width. The first driving pad portion includes a first pad through which an electrical signal transmits between the first driving pad portion and the integrated circuit chip, and a second pad by which alignment between the first driving pad portion and the integrated circuit chip is determined. The second pad of the first driving pad portion includes a (2-1)-th pad having a width which is the same as the width of the solder bump and a (2-2)-th pad having a width which is larger than the width of the (2-1)-th pad.

20 Claims, 19 Drawing Sheets

PAD1

P1

A A'

P1

P3 P2 P2

B B'

DR2

DR1

(b)

(a)

(a)

(b)

(c)

(d)

DR2

DR1

ALIGNMENT PAD OF DISPLAY PANEL AND DISPLAY DEVICE HAVING THE SAME

This application claims priority to Korean Patent Application No. 10-2022-0003992 filed on Jan. 11, 2022, and all the benefits accruing therefrom under 35 U.S.C. § 119, the entire contents of which are incorporated herein by reference.

BACKGROUND

(a) Field

The present disclosure relates to a display device.

(b) Description of the Related Art

A display device, such as a light emitting display device, includes a display panel including pixels that display an image. In order to control an operation of the display panel, the display panel includes one or more pad portion in which pads for input and/or output of signals to and from the display panel are arranged. An integrated circuit chip (IC chip) or a flexible printed circuit board may be bonded to the pad portion for connection to the display panel.

SUMMARY

Embodiments are to provide a display device including a pad portion with which alignment between the pad portion and an integrated circuit chip may be easily determined.

An embodiment provides a display device including a display panel including a display area and a non-display area, and a first driving pad portion in the non-display area and connected to an integrated circuit chip, where the first driving pad portion includes a first pad receiving an electrical signal from the integrated circuit chip, and a second pad confirming alignment between the first driving pad portion and the integrated circuit chip. The integrated circuit chip includes a solder bump overlapping the first driving pad portion, and the second pad includes a (2-1)-th pad having the same width as a width of the solder bump, and a (2-2)-th pad having a larger width than the width of the (2-1)-th pad.

The (2-1)-th pad may include a (2-1)-th opening having a polygonal shape, and a (2-1)-th line portion surrounding an edge of the (2-1)-th opening, and the (2-2)-th pad may include a (2-2)-th opening having a polygonal shape, and a (2-2)-th line portion surrounding an edge of the (2-2)-th opening.

A width of the (2-1)-th line portion and a width of the solder bump may be the same.

A width of the (2-2)-th line portion may be larger than the width of the solder bump.

The width of the (2-2)-th line portion may be a sum of the width of the solder bump and twice a first distance, and the first distance may correspond to a reference value determining misalignment between the integrated circuit chip and the first driving pad portion.

The solder bump may completely overlap the (2-2)-th pad portion.

A plurality of the second pads may be disposed along a first direction, and the (2-1)-th pad and the (2-2)-th pad may be alternately disposed.

The plurality of the second pad may include n pieces of the (2-2)-th pads and (n-1) pieces of the (2-1)-th pads that are alternately disposed along the first direction.

A plurality of the second pads may be disposed along a second direction, and the (2-1)-th pad and the (2-2)-th pad may be alternately disposed.

The plurality of the second pads may include n pieces of the (2-2)-th pads and (n-1) pieces of the (2-1)-th pads that are alternately disposed along the second direction.

An embodiment provides a display device including a display panel including a display area and a non-display area, and a first driving pad portion in the non-display area and connected to an integrated circuit chip, where the first driving pad portion may include a first pad receiving an electrical signal from the integrated circuit chip, and a second pad confirming alignment between the first driving pad portion and the integrated circuit chip. The integrated circuit chip includes a solder bump overlapping the first driving pad portion, and the second pad includes a first area having the same width as a width of the solder bump, and a second area having a larger width than that of the first area.

The second pad may include two first areas, and one second area which is between the first areas.

The width of the first area and the width of the solder bump may be the same.

The width of the second area may be larger than the width of the solder bump.

The width of the second area may be a sum of the width of the solder bump and twice a first distance, and the first distance may correspond to a reference value determining misalignment between the integrated circuit chip and the first driving pad portion.

The solder bump may be positioned within an edge (or line portion) of the second pad at the second area.

The second pad may include two second areas, and one first area between the second areas.

The second pad may include one second area and one first area.

The second pad may be provided in plural along a first direction or along a second direction perpendicular to (or crossing) the first direction.

The first pad may have a rectangular shape or a parallelogram shape in a plan view.

According to the embodiments, a pad portion is provided having a shape that may easily determine whether alignment between the pad portion and an integrated circuit chip is correct. According to the embodiments, providing a display device in which a manufacturing process is simplified is possible.

BRIEF DESCRIPTION OF THE DRAWINGS

The above and other advantages and features of this disclosure will become more apparent by describing in further detail embodiments thereof with reference to the accompanying drawings, in which:

FIG. 1D illustrates an enlarged cross-sectional view of a display area according to an embodiment.

FIG. 2 illustrates atop plan view of a first driving pad portion overlapping an integrated circuit chip according to an embodiment.

DETAILED DESCRIPTION

Figure 1A:
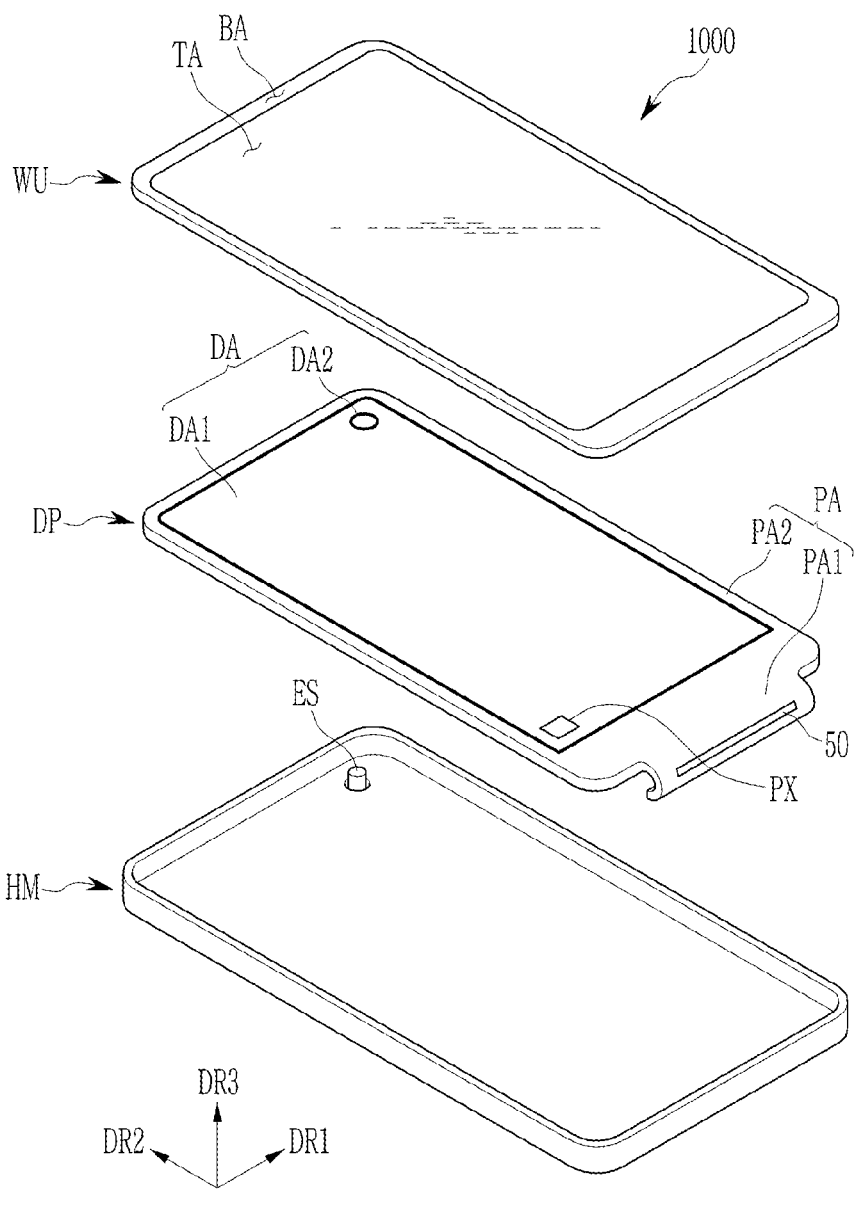
FIG. 1A illustrates an exploded perspective view of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly describe the invention, parts or portions that are irrelevant to the description are omitted, and identical or similar constituent elements throughout the specification are denoted by the same reference numerals. As used herein, a reference number may indicate a singular element or a plurality of the element. For example, a reference number labeling a singular form of an element within the drawing figures may be used to reference a plurality of the singular element within the text of specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a schematic structure of a display device 1000 will be described with reference to FIG. 1A. FIG. 1A illustrates an exploded perspective view of a display device 1000 according to an embodiment.

Referring to FIG. 1A, a display device 1000 according to an embodiment is a device for displaying a moving image or a still image. The display device 1000 may be used as (or define) a display screen of a portable electronic device such as a mobile phone, a smart phone, a tablet personal computer (PC), a mobile communication terminal, an electronic notebook, an electronic book, a portable multimedia players (PMP), a navigation device, and an ultra-mobile PC (UMPC). The display device 1000 may be used as a display screen of various products such as a television set, a laptop computer, a monitor, a billboard, and an Internet of things (IOT). In addition, the display device 1000 according to one or more embodiment may be used in a wearable device such as a smart watch, a watch phone, a glasses display, and a head mounted display (HMD). In addition, the display device 1000 according to one or more embodiment may be used as an instrument panel of a vehicle, a center information display (CID) disposed on a center fascia or dashboard of a vehicle, a room mirror display that replaces a side mirror of a vehicle, and a display disposed on the back of a front seat for entertainment for a rear seat of a vehicle. For better comprehension and ease of description, FIG. 1A illustrates a case in which that the display device 1000 is used for a smart phone.

The display device 1000 may display an image toward a third direction DR3 on a display surface parallel to a plane defined by a first direction DR1 and a second direction DR2 crossing each other. A display surface on which an image is displayed may correspond to a front surface of the display device 1000, and may correspond to a front surface of a cover window WU. An image may include a static image as well as a dynamic image.

In the present embodiment, a front (or top) surface and a rear (or bottom) surface of each member are defined based on a direction in which an image is displayed. The front and rear surfaces may be opposite to each other in (or along) the third direction DR3, and a normal direction relative to each of the front and rear surfaces may be parallel to the third direction DR3. A separation distance in the third direction DR3 between the front and rear surfaces may correspond to a thickness of the display device 1000 and various components or layers thereof (e.g., a display panel DP in the third direction DR3.

The display device 1000 according to the embodiment may detect an external input applied from the outside (e.g., outside of the display device 1000). The external input may include various types of external inputs such as light, heat, pressure or proximity, where the input may be applied from an input tool such as a body part (e.g., a part of a user's body) a pen, etc. The external input may be variously provided, and the display device 1000 may sense the external input applied to the lateral and/or rear surface of the display device 1000 according to the structure of the display device 1000.

The display device 1000 may include the cover window WU, a housing HM, a display panel DP, and an optical element ES. In the embodiment, the cover window WU and the housing HM may be combined to form an appearance of the display device 1000 (e.g., an outer appearance of the display device 1000).

The cover window WU may include an insulating panel. For example, the cover window WU may be made of (or include) glass, plastic, or a combination thereof.

A front surface of the cover window WU may define the front surface of the display device 1000. A transmissive area TA may be an optically transparent area. For example, the transmissive area TA may be an area (e.g., planar area) having visible (light) ray transmittance of about 90% or more.

A blocking area BA may define a shape (e.g., planar shape) of the transmissive area TA. The blocking area BA may be adjacent to the transmissive area TA, and may surround the transmissive area TA. The blocking area BA may be an area having relatively low light transmittance compared with a light transmittance of the transmissive area TA. The blocking area BA may include an opaque material that blocks light. The blocking area BA may have a predetermined color. The blocking area BA may be defined by a bezel layer provided separately from a transparent substrate defining the transmissive area TA, or may be defined by an ink layer formed by (e.g., provided by) being inserted into or coloring the transparent substrate.

The display panel DP may include a display area DA and a non-display area PA which is adjacent to the display area DA. The display area DA may be an area in which a pixel operates to emit light according to an electrical signal. A front surface of the display panel DP may include the a display area DA and a non-display area PA.

In the embodiment, the display area DA may be an area that includes a pixel PX and in which an image is displayed, and may be an area in which a touch sensor is disposed at an upper side of the pixel PX in the third direction DR3 to sense an external input.

The transmissive area TA of the cover window WU may at least partially overlap (or correspond to) the display area DA of the display panel DP. For example, the transmissive area TA may overlap the front surface of the display area DA, or may overlap at least a portion of the display area DA. Accordingly, an image may be viewable through the transmissive area TA, or may provide an external input based on the image. However, the invention is not limited thereto. For example, the display area DA may be divided into an area in which an image is displayed and an area in which an external input is sensed.

The non-display area PA of the display panel DP may at least partially overlap the blocking area BA of the cover window WU. The non-display area PA may be an area covered by the blocking area BA. The non-display area PA may be adjacent to the display area DA, and may surround the display area DA. No image is displayed in the non-display area PA, and a driving circuit or driving wire for driving the display area DA may be disposed therein. The non-display area PA may include a first non-display area PA1 including a connecting wire and a bending area, and a second non-display area PA2 positioned adjacent to and outside the display area DA. In the embodiment of FIG. 1A, the second non-display area PA2 is positioned at three sides of the display area DA, and the first non-display area PA1 is positioned at the other side of the display area DA. Various components or layers of the display device 1000 may include a transmissive area TA, a blocking area BA, a display area DA, a non-display area PA, etc. corresponding to those described above.

In the embodiment, the display panel DP may be assembled in a flat state in which the display area DA and the non-display area PA are directed to (e.g., facing) the cover window WU. However, the invention is not limited thereto.

As being flat, a component may be disposed in a single plane. A portion of the non-display area PA of the display panel DP may be bendable, such as to be bent. In this case, the display panel DP which is bent (such as at the bending area) may dispose a portion of the non-display area PA facing the rear surface of the display device 1000, so that the blocking area BA visible from the front surface of the display device 1000 may be reduced. The display panel DP which is bent may dispose a portion of the first non-display area PA1 under the display area DA (e.g., facing the rear surface of the display device 1000 at the display area DA), so that the bent display device may be assembled into an electronic device.

In addition, the display area DA may include a first display area DA1 and a second display area DA2. A plurality of light emitting elements, and a plurality of pixel circuit parts that generate and transmit a light emitting current to each of the plurality of light emitting elements, are formed in the first display area DA1. Here, one light emitting element and one pixel circuit part are referred to as a pixel PX. In an embodiment, one pixel circuit part and one light emitting element are formed at a one-to-one ratio in the first display area DA1. The second display area DA2 may be an area in which a component using infrared light, visible light, or sound to provide a function of the display device 1000, is disposed.

An integrated circuit chip 50 may be mounted on the first non-display area PA1, and may be mounted on a bending portion or positioned on one of respective sides of the bending portion. The integrated circuit chip 50 may be electrically connected to the display area DA to transmit an electrical signal to the display area DA. For example, the integrated circuit chip 50 may be connected to the pixels PX disposed in the display area DA to provide data signals thereto. The integrated circuit chip 50 may include various circuits in addition to the above-described circuits, or may be designed to provide various electrical signals to the display area DA.

A pad portion may be positioned at an end of the first non-display area PA1 (e.g., a distal end of the display panel DP), and the display device 1000 may be electrically connected to a flexible printed circuit board FPCB at the pad portion. Here, a driving chip FPCB-IC positioned on the flexible printed circuit board FPCB may include various driving circuits for driving the display device 1000 and/or connectors for supplying of power. In some embodiments, instead of the flexible printed circuit board FPCB, a rigid printed circuit board (PCB) may be used.

The optical element ES may be disposed under the display panel DP. That is the optical element ES may face the cover window WU with the display panel DP therebetween. The optical element ES may be an electronic element using light or sound to provide a function to the display device 1000 such as detecting light or sound, outputting light or sound, measuring a distance, recognizing a fingerprint, etc. For example, the optical element ES may be a sensor that receives and uses light such as an infrared sensor, a sensor that outputs and detects light or sound to measure a distance or recognize a fingerprint, a small-sized lamp that outputs light, a speaker that outputs sound, and the like. In a case of an electronic element using light, light of various wavelength bands such as visible light, infrared light, and ultraviolet light may be used. In addition, the optical element ES may be at least one of a camera, an infrared camera (IR camera), a dot projector, an infrared illuminator, and a time-of-flight sensor (ToF sensor).

The housing HM may be combined with the cover window WU. The cover window WU may be disposed on the front surface of the housing HM. The housing HM may be combined with the cover window WU to provide a predetermined accommodation space (e.g., inner space) in which components of the display device 1000 are accommodated. The display panel DP and the optical element ES may be accommodated in the predetermined accommodation space provided between the housing HM and the cover window WU.

The housing HM may include a material with relatively high rigidity. For example, the housing HM may include a plurality of frames and/or plates made of glass, plastic, or metal, or a combination thereof. The housing HM may stably protect the components of the display device 1000 accommodated in an inner space thereof from external impact.

Figure 1B:
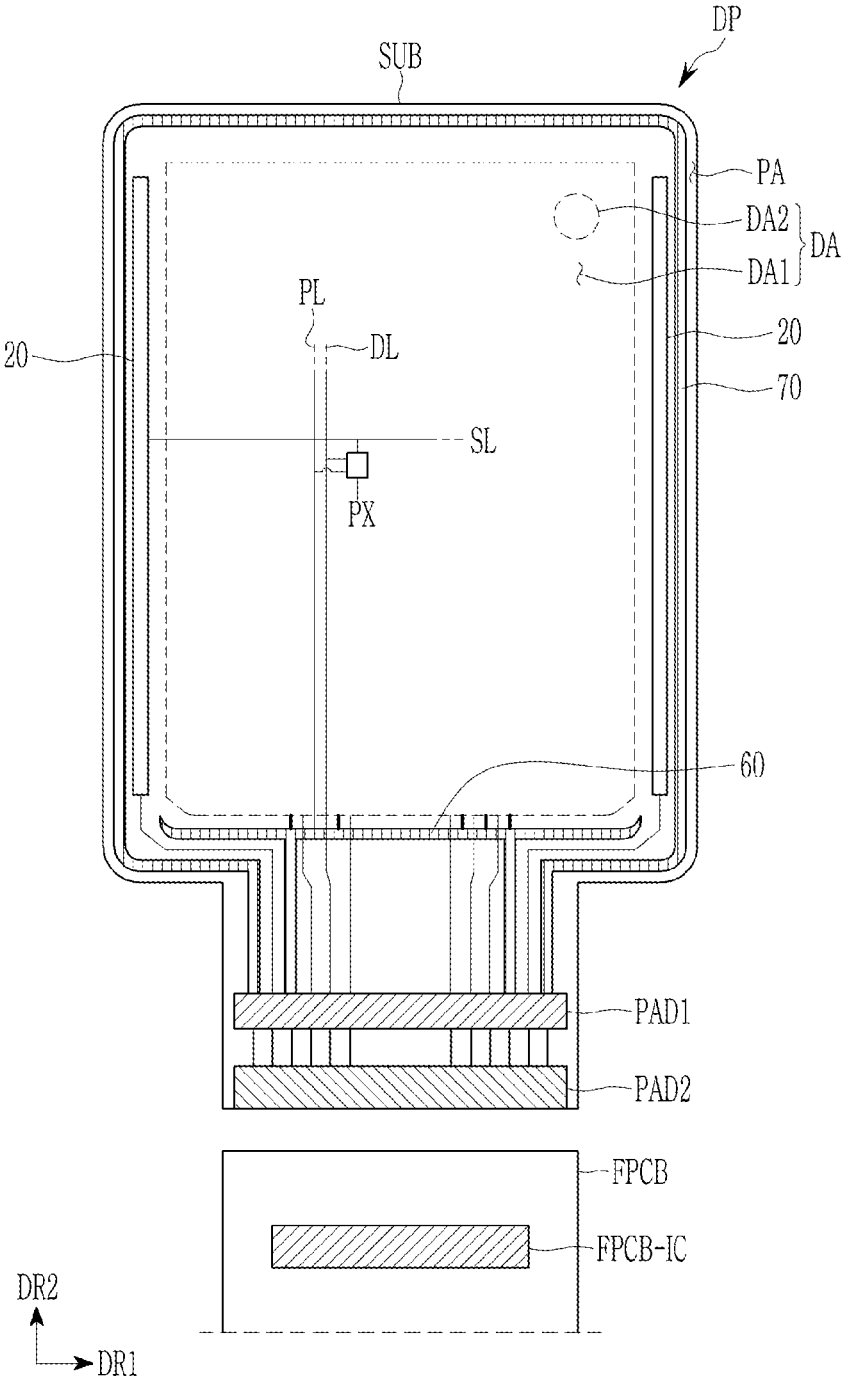
FIG. 1B illustrates a top plan view of a display panel according to an embodiment.

Hereinafter, a structure of the display panel DP will be described, and first, the structure of the display panel DP will be described in detail with reference to FIG. 1B. FIG. 1B illustrates a top plan view of some constituent elements of a display panel DP according to an embodiment.

Referring to FIG. 1B, the display panel DP includes a plurality of pixels PX. The plurality of pixels PX may be disposed in the display area DA. Each of the pixels PX includes a light emitting element and a pixel circuit which is connected to the light emitting element. Each pixel PX emits, for example, red, green, blue, or white light, and may include a light emitting diode as an example.

The display panel DP may include a plurality of signal lines and a pad portion. The plurality of signal lines may include a scan line SL extending in the first direction DR1, and a data line DL and a driving voltage line PL extending in the second direction DR2.

A scan driver 20 is positioned at the left and right of the display area DA, and generates and transmits a scan signal to each pixel PX through the scan line SL. The pixel PX may receive scan signals together from two scan drivers 20 positioned at the left and right sides.

A driving voltage supply wire 60 is disposed on the non-display area PA. For example, the driving voltage supply wire 60 may be disposed between a first driving pad portion PAD1 and the display area DA. The driving voltage supply wire 60 provides a driving voltage ELVDD to the pixels PX. The driving voltage supply wire 60 may extend in the first direction DR1, and may be connected to a plurality of driving voltage lines PL disposed in the second direction DR2.

A common voltage supply wire 70 is disposed on the non-display area PA. The common voltage supply wire 70 may have a shape corresponding to a shape of a substrate SUB. The shape of the substrate SUB may be defined by an outer edge thereof, and the common voltage supply wire 70 may extend along the outer edge of the substrate SUB. The common voltage supply wire 70 transmits a common voltage ELVSS to one electrode (for example, a cathode) of the light emitting element included in the pixel PX.

The display panel DP according to the embodiment may include the first driving pad portion PAD1 and a second driving pad portion PAD2.

The first driving pad portion PAD1 may extend from and/or be connected to the data line DL to be disposed in the non-display area PA. The second driving pad portion PAD2 may extend from and/or be connected to each of the scan driver 20, the driving voltage supply wire 60, and the common voltage supply wire 70, to be disposed in the non-display area PA.

The first driving pad portion PAD1 may be exposed to outside the display panel DP, without being covered by an insulating layer of the display panel DP, to be electrically connected to an external component such as the integrated circuit chip 50 as shown in FIG. 1A. The integrated circuit chip 50 may provide driving signals and data as electrical signals to the pixel PX of the display area DA. The integrated circuit chip 50 and the first driving pad portion PAD1 may be bonded to each other through a direct bond such as a solder bump BP, or electrically connected to each other through an intervening element such as an anisotropic conductive film. The integrated circuit chip 50 may be mounted on the display panel DP by a chip on plastic (COP) method or a chip on glass (COG) method.

The integrated circuit chip 50 shown in FIG. 1A is disposed on the non-display area PA, and particularly may be disposed to overlap the first driving pad portion PAD1 of FIG. 1B. The integrated circuit chip 50 generates a data voltage to be applied to each pixel PX to transmit the data voltage to each data line DL. The integrated circuit chip 50 may be disposed at one side of the display panel DP, for example between a flexible printed circuit board FPCB and the display area DA.

The second driving pad portion PAD2 may be exposed to outside the display panel DP without being covered by an insulating layer of the display panel DP, to be electrically connected to the flexible printed circuit board FPCB. The flexible printed circuit board FPCB may transmit a signal or power of a driving chip FPCB-IC from outside the display panel DP and to the display panel DP through the second driving pad portion PAD2. The flexible printed circuit board FPCB and the second driving pad portion PAD2 may be bonded to each other through solder bumps BP, or electrically connected to each other through an anisotropic conductive film.

The driving chip FPCB-IC included in the flexible printed circuit board FPCB changes a plurality of image signals transmitted from the outside of the display panel DP, into a plurality of image data signals, and transmits the changed signals to the integrated circuit chip 50 through a plurality of pads disposed in the first driving pad portion PAD1. In addition, the driving chip FPCB-IC receives a vertical synchronization signal, a horizontal synchronizing signal, and a clock signal to generate a control signal for controlling operations of the scan driver 20 and the integrated circuit chip 50 to respectively transmit the generate signal to the scan driver 20 and the integrated circuit chip 50 through a pad of the second driving pad portion PAD2 and a pad of the first driving pad portion PAD1. The driving chip FPCB-IC transmits the driving voltage ELVDD to the driving voltage supply wire 60 through a pad positioned on the second driving pad portion PAD2. In addition, the driving chip FPCB-IC may transmit the common voltage ELVSS to each of the common voltage supply wires 70 through a pad positioned on the second driving pad portion PAD2.

Figure 1C:
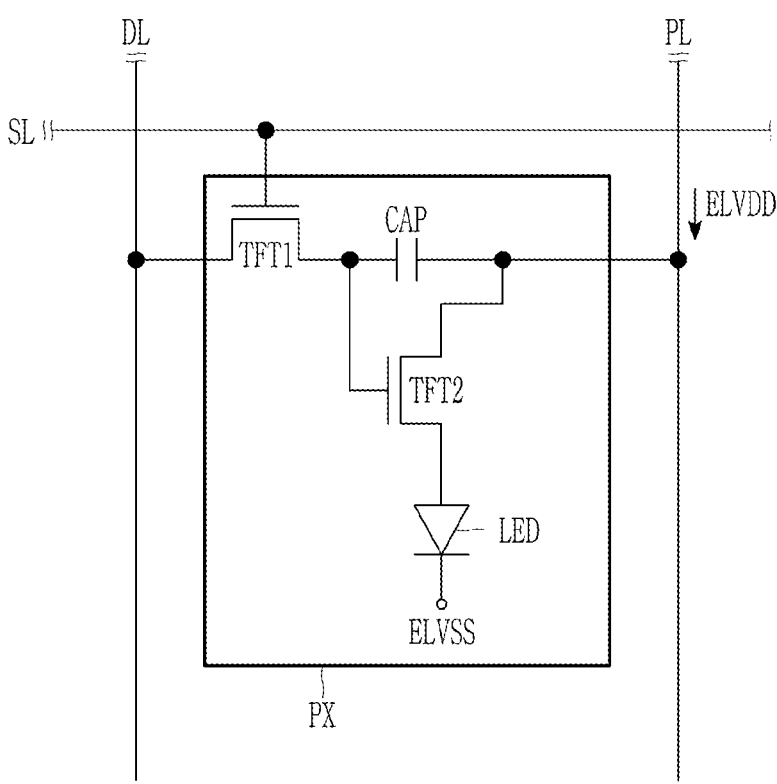
FIG. 1C illustrates an equivalent circuit diagram of a pixel according to an embodiment.

Hereinafter, one pixel disposed in the display area DA will be described with reference to FIG. 1C. FIG. 1C illustrates an equivalent circuit diagram of a pixel PX according to an embodiment of the invention.

FIG. 1C illustrates a pixel PX that is electrically connected to one scan line SL, one data line DL, and one driving voltage line PL, as an example. The configuration of the pixel PX is not limited thereto, and may be modified and implemented.

One pixel PX includes a light emitting diode LED. The light emitting diode LED may be a top light emitting diode or a bottom light emitting diode. The pixel PX includes a circuit portion for driving the light emitting diode LED, and the circuit portion includes a first transistor TFT1 (or a switching transistor), a second transistor TFT2 (or a driving transistor), and a capacitor CAP.

The first transistor TFT1 outputs a data signal applied to the data line DL in response to a scan signal applied to the scan line SL. The capacitor CAP is charged with a voltage corresponding to the data signal received from the first transistor TFT1.

The second transistor TFT2 is connected to the light emitting diode LED. The second transistor TFT2 controls a driving current (e.g., electrical current) flowing through the light emitting diode LED in response to an amount of charge (e.g., electrical) stored in the capacitor CAP. The light emitting diode LED emits light during a period in which the second transistor TFT2 is turned on.

Figure 1D:
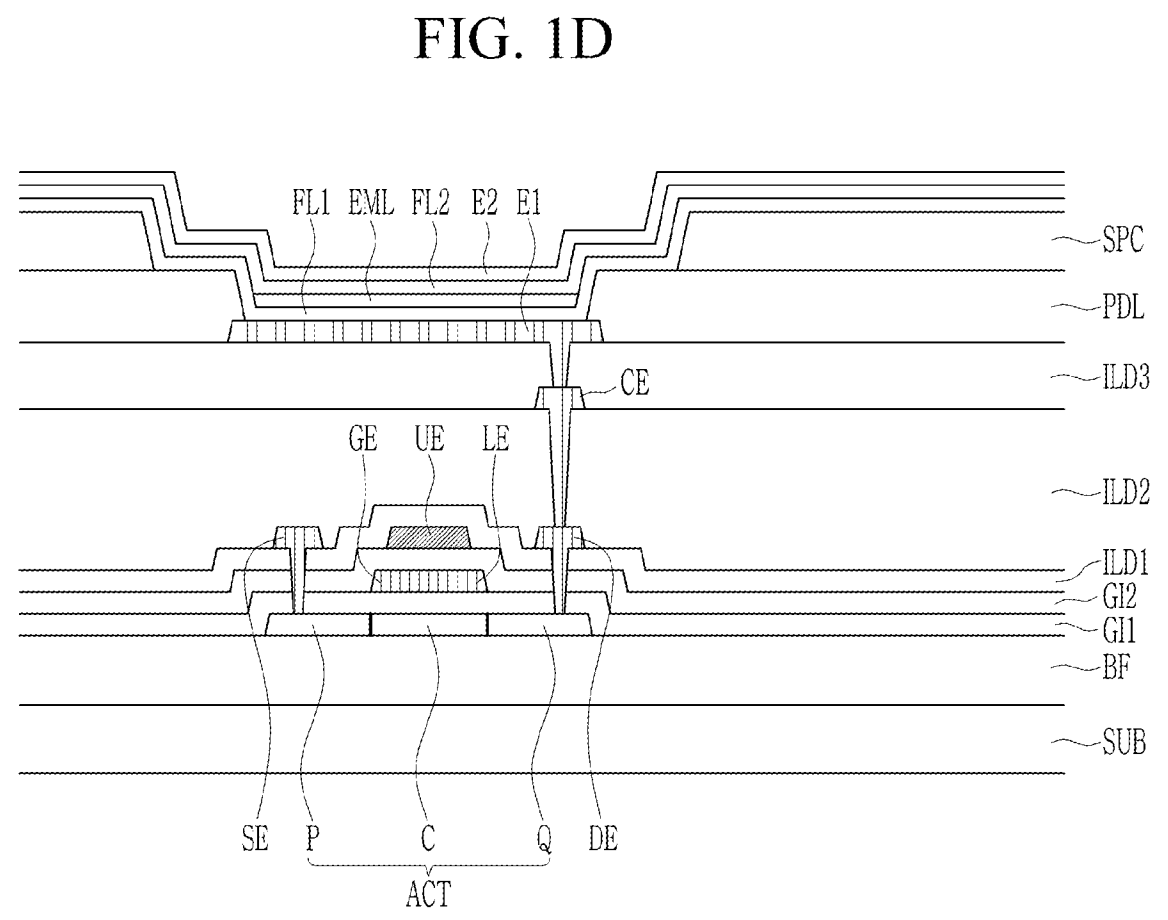

Hereinafter, a stacked structure of a display area DA according to an embodiment will be described with reference to FIG. 1D. FIG. 1D illustrates a cross-sectional view of constituent elements disposed in a display area DA according to an embodiment.

A display panel DP according to an embodiment includes the substrate SUB. The substrate SUB may include an inorganic insulating material such as glass or an organic insulating material such as plastic such as polyimide (PI). The substrate SUB may be single-layered or multi-layered. The substrate SUB may have a structure in which at least one base layer and at least one inorganic layer, which include polymer resins sequentially stacked, are stacked on each other such as to face each other.

The substrate SUB may have various degrees of flexibility. The substrate SUB may be a rigid substrate, or a flexible substrate that is bendable, foldable, or rollable.

A buffer layer BF may be positioned on the substrate SUB. The buffer layer BF blocks impurities from being transmitted from the substrate SUB to an upper side of the buffer layer BF, particularly a semiconductor layer ACT, thereby preventing characteristic degradation of the semiconductor layer ACT and reducing stress that may be applied thereto from the bending, folding, rolling, etc. of the display panel DP. The buffer layer BF may include an inorganic insulating material such as a silicon nitride or a silicon oxide, or an organic insulating material. A portion or all of the buffer layer BF may be omitted.

The semiconductor layer ACT is positioned on the buffer layer BF. The semiconductor layer ACT may include at least one of polycrystalline silicon and an oxide semiconductor. The semiconductor layer ACT includes a channel area (C), a first area (P), and a second area (Q). The first area (P) and the second area (Q) are disposed at opposing sides of the channel area (C), respectively. The channel area (C) may include a semiconductor with a small amount of impurity doped or a semiconductor with no impurity doped, and the first area (P) and the second area (Q) may include semiconductors with a large amount of impurity doped as compared to the channel area (C). The semiconductor layer ACT may be formed of an oxide semiconductor, and in this case, a separate passivation layer (not shown) may be added to protect an oxide semiconductor material that is vulnerable to external environments such as a high temperature.

A first gate insulating layer GI1 is positioned on the semiconductor layer ACT. The first gate insulating layer GI1 may be a single layer or multilayer including at least one of a silicon oxide ($SiO_x$), a silicon nitride ($SiN_x$), and a silicon oxynitride ($SiO_xN_y$).

A gate electrode GE and a lower electrode LE are positioned on the first gate insulating layer GI1. The gate electrode GE and the lower electrode LE may be integrally formed as one body. The gate electrode GE and the lower electrode LE may be a single layer or a multilayer structure along the thickness direction, in which metal films containing one of copper (Cu), a copper alloy, aluminum (Al), an aluminum alloy, molybdenum (Mo), a molybdenum alloy, titanium (Ti), and a titanium alloy are stacked. The gate electrode GE may overlap the channel area (C) of the semiconductor layer ACT.

A second gate insulating layer GI2 and an upper electrode UE may be positioned on the gate electrode GE, the lower electrode LE, and the first gate insulating layer GI1. The upper electrode UE and the lower electrode LE may form a capacitor.

A first insulating layer ILD1 is positioned on the upper electrode UE. The first insulating layer ILD1 may be a single layer or a multilayer including at least one of a silicon oxide ($SiO_x$), a silicon nitride ($SiN_x$), and a silicon oxynitride ($SiO_xN_y$).

A source electrode SE and a drain electrode DE are positioned on the first insulating layer ILD1. The source electrode SE and the drain electrode DE are connected to the first area (P) and the second area (Q) of the semiconductor layer ACT through contact holes formed in (or defined by) the first insulating layer ILD1, respectively.

The source electrode SE and the drain electrode DE may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or a multi-layered structure including them.

A second insulating layer ILD2 is positioned on the first insulating layer ILD1, the source electrode SE, and the drain electrode DE. The second insulating layer ILD2 may include an organic insulating material such as a general purpose polymer such as poly(methylmethacrylate) (PMMA) or polystyrene (PS), a polymer derivative having a phenolic group, an acryl-based polymer, an imide-based polymer, a polyimide, an acryl-based polymer, and a siloxane-based polymer. The second insulating layer ILD2 formed as a single layer is illustrated in the present specification, but the invention is not limited thereto, and the second insulating layer ILD2 may be formed as a multilayer.

A connecting electrode CE is positioned on the second insulating layer ILD2. The connecting electrode CE may be omitted according to embodiments.

A third insulating layer ILD3 and a first electrode E1 are positioned on the second insulating layer ILD2. The first electrode E1 is connected to the connecting electrode CE through a contact hole of the third insulating layer ILD3, and is electrically connected to the drain electrode DE.

The first electrode E1 may include a metal such as silver (Ag), lithium (Li), calcium (Ca), aluminum (Al), magnesium (Mg), or gold (Au), and may also include a transparent conductive oxide (TCO) such as an indium tin oxide (ITO) or an indium zinc oxide (IZO). The first electrode E1 may be formed of a single layer including a metal material or a transparent conductive oxide, or a multilayer including them. For example, the first electrode E1 may have a triple-layered structure of indium tin oxide (ITO)/silver (Ag)/indium tin oxide (ITO).

A transistor configured of the gate electrode GE together with the semiconductor layer ACT, the source electrode SE, and the drain electrode DE is connected to the first electrode E1 to supply a current (e.g., electrical current) to a light emitting element.

A partition wall PDL is positioned on the third insulating layer ILD3 and the first electrode E1.

The partition wall PDL overlaps at least a portion of the first electrode E1, and has an opening defining a light emitting area. The opening may have a planar shape substantially similar to a planar shape of the first electrode E1. The opening may have a circular shape in a plan view, but is not limited thereto, and may have various shapes such as a rhombus or an octagonal shape similar to a rhombus, a rectangular shape, a polygonal shape, and an elliptical shape.

The partition wall PDL may include an organic insulating material. Alternatively, the partition wall PDL may include an inorganic insulating material such as a silicon nitride, a silicon oxynitride, or a silicon oxide. Alternatively, the partition wall PDL may include an organic insulating material and an inorganic insulating material. In the embodiment, the partition wall PDL includes a light-blocking material, and may be provided in black. The light blocking material may include carbon black, a carbon nanotube, a resin or paste containing a black dye, metal particles such as nickel, aluminum, molybdenum, and an alloy thereof, a metal oxide particle (for example, chromium oxide), or a metal nitride particle (for example, chromium nitride). When the partition wall PDL includes a light blocking material, reflection of external light by metal structures or conductive layers disposed under the partition wall PDL may be reduced. However, the invention is not limited thereto. In an embodiment, the partition wall PDL may include a light transmitting organic insulating material without including a light blocking material.

A spacer SPC may be disposed on the partition wall PDL. The spacer SPC may include an organic insulating material such as polyimide. Alternatively, the spacer SPC may include an inorganic insulating material such as a silicon nitride ($SiN_x$) or a silicon oxide ($SiO_2$), or may include an organic insulating material and an inorganic insulating material.

In the embodiment, the spacer SPC may include the same material as the partition wall PDL. In this case, the partition wall PDL and the spacer SPC may be formed together as one body, such as in a mask process using a half tone mask or the like. In the embodiment, the partition wall PDL and the spacer SPC may include different materials.

A light emitting layer EML is positioned on the first electrode E1. The light emitting layer EML may include an organic material and/or an inorganic material. The light emitting layer EML may generate predetermined colored light.

A first functional layer FL1 may be positioned between the light emitting layer EML and the first electrode E1, and a second functional layer FL2 may be positioned between the light emitting layer EML and the second electrode E2.

The first functional layer FL1 may include at least one of a hole injection layer (HIL) and a hole transporting layer (HTL), and the second functional layer FL2 may include at least one of an electron transporting layer (ETL) and an electron injection layer (EIL).

The first functional layer FL1 and the second functional layer FL2 may be integrally formed to entirely cover the substrate SUB, respectively. Each of the first functional layer FL1 and the second functional layer FL2 may be formed to entirely cover the display area DA of the substrate SUB (e.g., cover an entirety of the display area DA).

The second electrode E2 is positioned on the light emitting layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), or molybdenum (Mo) or a transparent conductive oxide (TCO) such as an indium tin oxide (ITO) or an indium zinc oxide (IZO).

The first electrode E1, the light emitting layer EML, and the second electrode E2 may together configure a light emitting element. Here, the first electrode E1 may be an anode, which is a hole injection electrode, and the second electrode E2 may be a cathode, which is an electron injection electrode. However, the embodiment is not necessarily limited thereto, and a first electrode E1 may be a cathode and a second electrode E2 may be an anode, according to a driving method of the light emitting display device.

Holes and electrons are injected into the light emitting layer EML from the first electrode E1 and the second electrode E2, respectively, and light is emitted when excitons in which the injected holes and electrons are combined enter a ground state from an excited state.

Figure 2:
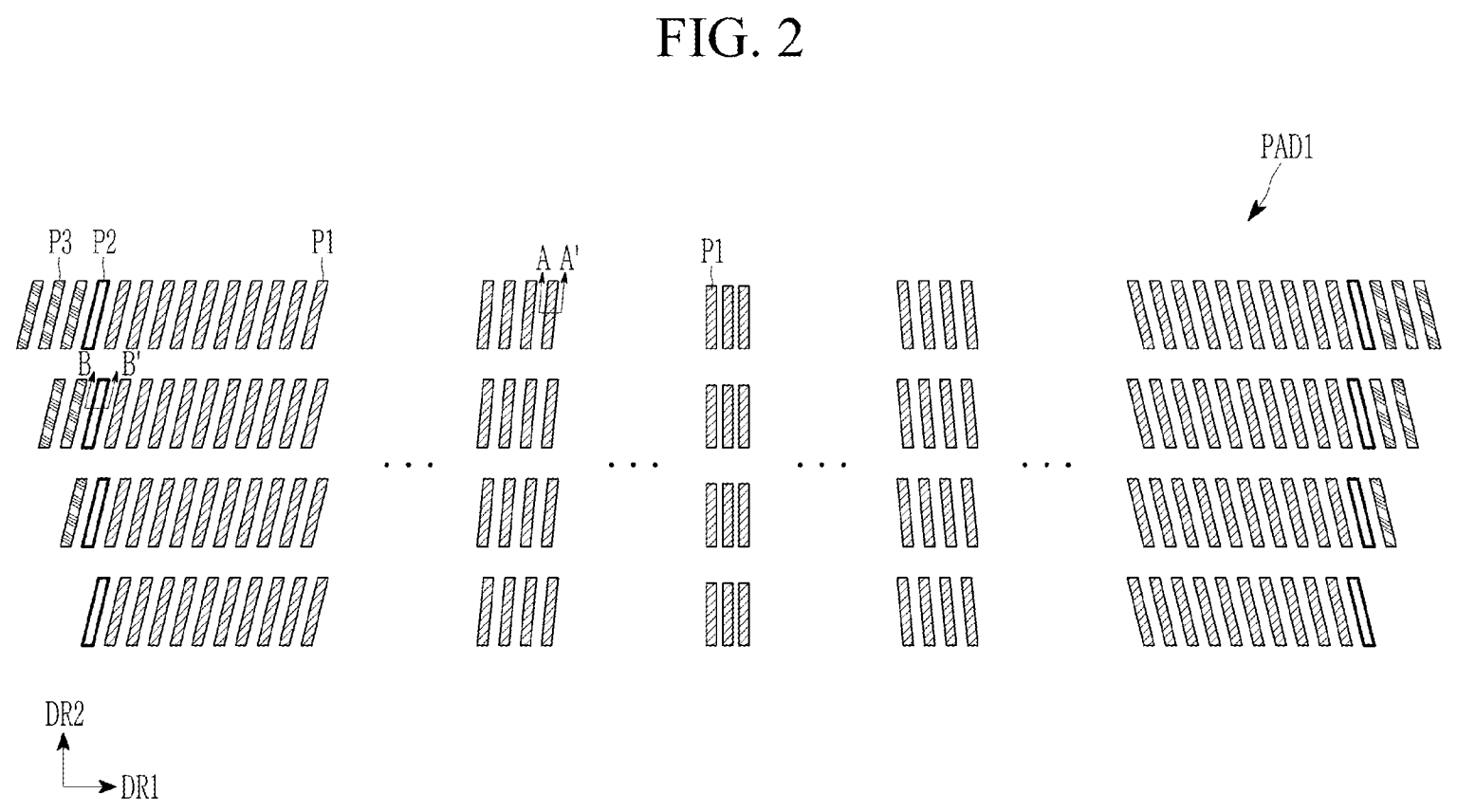

Hereinafter, a first driving pad portion PAD1 according to an embodiment will be described with reference to FIG. 2 to FIG. 5. FIG. 2 illustrates a top plan view of a first driving pad portion PAD1 overlapping (or corresponding to) an integrated circuit chip 50 according to an embodiment.

Referring to FIG. 2 together with the above drawings, the first driving pad portion PAD1 may be provided in an area overlapping the integrated circuit chip 50. The first driving pad portion PAD1 may be electrically connected to circuits inside the integrated circuit chip 50.

The first driving pad portion PAD1 may include a plurality of pads including a first pad P1, a second pad P2, and a third pad P3.

The first pad P1 may be a pad electrically connected to the integrated circuit chip 50 to transmit a predetermined signal to the display area DA.

The first driving pad portion PAD1 may include a middle area (or center) along the first direction DR1, and opposing edges which are opposite to each other along the first direction DR1. The first driving pad portion PAD1 may include a plurality of columns extended along the second direction DR2 and spaced apart from each other along the first direction DR1. A plurality of pads may be arranged in a respective column (e.g., a pad column). Among a plurality of the first pads P1 included in the first driving pad portion PAD1, the first pad P1 disposed in a middle area of the first driving pad portion PAD1 may have a rectangular shape. For example, the first pads P1 of a plurality of columns disposed in the middle area (or closest to the middle area) may have a rectangular shape. In addition, the first pads P1 excluding the first pads P1 disposed in the middle area may have a parallelogram shape. That is, as a distance along the first direction DR1 from the middle area to an end of the first driving pad portion PAD1 increases, a planar shape of the first pads P1 transitions from being closer to a rectangle to being closer to a parallelogram.

The second pad P2 may be a pad that may be combined to the integrated circuit chip 50 but to which a separate signal is not applied. The second pad P2 may be a floating pattern. The second pad P2 may be used only for checking alignment between the first driving pad portion PAD1 and the integrated circuit chip 50, and may not transmit a predetermined signal.

The second pad P2 may have a parallelogram shape in a plan view. The second pad P2 may include an edge of a parallelogram shape, and the inside of the second pad P2 may be empty in a plan view. That is, the second pad P2 may include an edge pattern or line pattern which forms a closed loop shape.

The second pad P2 may be disposed adjacent to an edge of the first driving pad portion PAD1. The embodiment in which the second pad P2 is disposed in an outer area of the first driving pad portion PAD1 is illustrated, but the invention is not limited thereto, and the second pad P2 may be disposed at any position of the first driving pad portion PAD1.

Four second pads P2 may be disposed in each of the left outer area and the right outer area of the first driving pad portion PAD1, and a plurality of the second pads P2 may be disposed along the second direction DR2, such as in a pad column. However, the invention is not limited to the above-mentioned number and disposition, and the number and disposition of the second pads P2 included in the first driving pad portion PAD1 may be variously changed according to embodiments.

The third pad P3 may be a dummy pad. The third pad P3 may not receive a predetermined signal like the second pad P2.

Figure 3A:
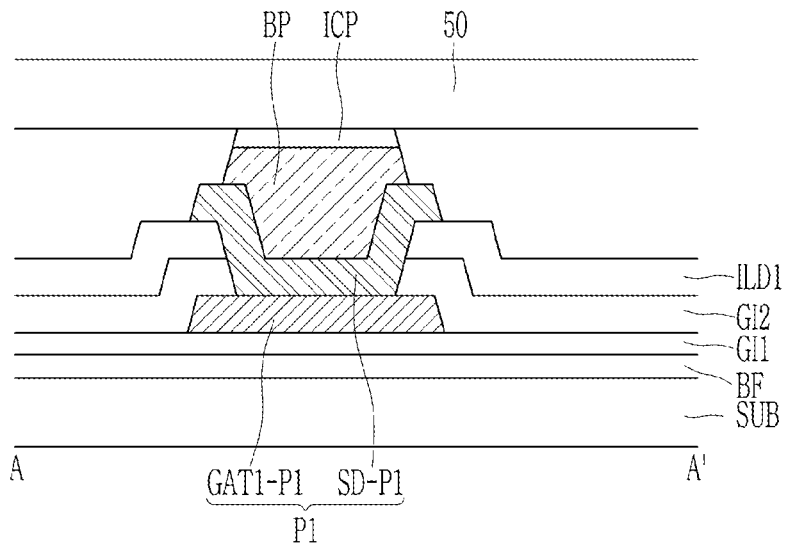
FIG. 3A illustrates a cross-sectional view of a first pad taken along line A-A' in FIG. 2.
Figure 3B:
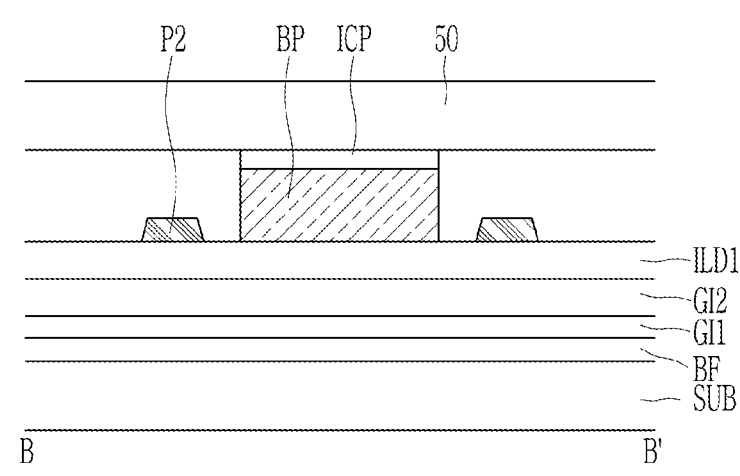
FIG. 3B illustrates a cross-sectional view of a second pad taken along line B-B' in FIG. 2.
Figure 3B:

Hereinafter, a cross-sectional shape of the first driving pad portion will be described with reference to FIG. 3A and FIG. 3B. FIG. 3A illustrates a cross-sectional view of the first pad P1 taken along line A-A' in FIG. 2, and FIG. 3B illustrates a cross-sectional view of the second pad P2 taken along line B-B' in FIG. 2.

Referring to FIG. 3A, the first pad P1 may include a (1-1)-th gate pad (GAT1-P1) (e.g., a first pad pattern) and a (1-1)-th data pad (SD-P1) (e.g., a second pad pattern).

The (1-1)-th gate pad (GAT1-P1) may be positioned on the first gate insulating layer GI1, and may be formed in the same process as the gate electrode GE positioned in the display area DA. As being formed in a same process, elements may be in a same layer as each other as respective portions of a same material layer, may be on a same layer by forming an interface with a same underlying or overlying layer, and/or may include a same material etc., without being limited thereto.

The (1-1)-th data pad (SD-P1) may be positioned on the first insulating layer ILD1, and may be formed in the same process as the source electrode SE and the drain electrode DE positioned in the display area DA.

The (1-1)-th gate pad (GAT1-P1) and the (1-1)-th data pad (SD-P1) may contact each other through (or at) a contact hole formed in the second gate insulating layer GI2 and the first insulating layer ILD1. The (1-1)-th gate pad (GAT1-P1) and the (1-1)-th data pad (SD-P1) may be electrically connected to each other through a contact hole formed in the second gate insulating layer GI2 and the first insulating layer ILD1. As being in contact, elements may form an interface therebetween, without being limited thereto.

The first pad P1 may be exposed to outside the display panel DP. The first pad P1 in FIG. 3A is exposed outside the first insulating layer ILD1 and is not covered by layers of the display panel DP which are above the first insulating layer ILD1 (e.g., the second insulating layer ILD2, the third insulating layer ILD3, etc. in FIG. 1D). The first pad P1 may be bonded to a chip pad ICP of the integrated circuit chip 50 through a solder bump BP.

Next, referring to FIG. 3B, the second pad P2 may be positioned on the first insulating layer ILD1. The second pad P2 may be formed in the display area DA in the same process as that of the source electrode SE and the drain electrode DE, but is not limited thereto. The second pad P2 may expose an underlying layer to outside the second pad P2, such as the first insulating layer ILD1 shown in FIG. 3B.

The second pad P2 may overlap the chip pad ICP of the integrated circuit chip 50. The second pad P2 may be bonded to the integrated circuit chip 50 through the solder bump BP.

Figure 4A:
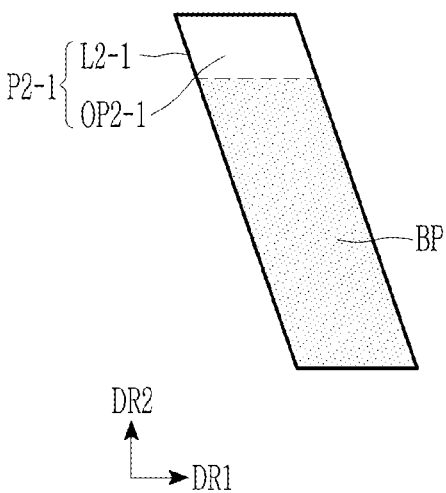
FIGS. 4A and 4B illustrate schematic top plan views of a second pad.
Figure 4B:
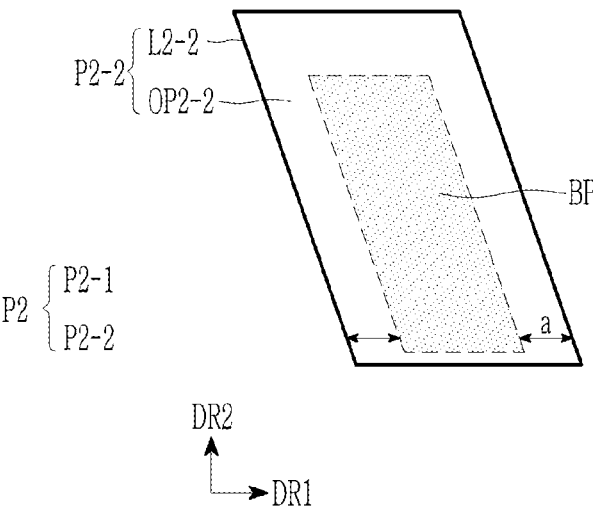

Hereinafter, the second pad P2 included in the first driving pad portion PAD1 according to an embodiment will be described with reference to FIGS. 4A and 4B. FIGS. 4A and 4B illustrate schematic top plan views of the second pad P2.

Referring to FIGS. 4A and 4B, the second pad P2 according to an embodiment may include at least one or more of a (2-1)-th pad P2-1, and at least one or more of a (2-2)-th pad P2-2. Hereinafter, one (2-1)-th pad P2-1 and one (2-2)-th pad P2-2 will be described.

In FIGS. 4A and 4B, the solder bumps BP of the integrated circuit chip 50 overlapping the second pad P2 are shown as a quadrangular shape indicated by dotted lines, and the solder bumps BP may represent the chip pad ICP of the integrated circuit chip 50 according to embodiments.

The (2-1)-th pad P2-1 according to the embodiment may have a parallelogram shape. In this case, a width of the (2-1)-th pad P2-1 may be substantially the same as a width of the solder bump BP, where the width is defined as a minor dimension in the plan view (e.g., substantially along the first direction DR1 in FIG. 4A). The solder bump BP may be disposed inside the (2-1)-th pad P2-1. The (2-1)-th pad P2-1 and the solder bump BP which completely overlap each other, indicates that the first driving pad portion PAD1 and the integrated circuit chip 50 are in a normal alignment state.

The (2-1)-th pad P2-1 may include a (2-1)-th line portion L2-1 and a (2-1)-th opening OP2-1. The (2-1)-th opening OP2-1 may have a parallelogram shape in a plan view, and the (2-1)-th line portion L2-1 may have a shape surrounding an edge of the parallelogram shape of the (2-1)-th opening OP2-1. The (2-1)-th line portion L2-1 may define an enclosed shape and the planar shape of the (2-1)-th opening OP2-1. The (2-1)-th line portion L2-1 may correspond to the second pad P2 labeled in FIG. 3B, without being limited thereto. The solder bump BP may be disposed within the (2-1)-th opening OP2-1 defined by the enclosed shape of the (2-1)-th line portion L2-1.

The (2-2)-th pad P2-2 according to the embodiment may have a parallelogram shape. In this case, a width of the (2-2)-th pad P2-2 may be larger than a width of the solder bump BP. The width of the (2-2)-th pad P2-2 may be increased along an entirety of the length of the second pad P2, without being limited thereto.

According to the embodiment, the width of the (2-2)-th pad P2-2 may be a sum of the width of the solder bump BP plus twice a first distance (a). The first distance (a) may be a reference value for determining misalignment between the integrated circuit chip 50 and the first driving pad portion PAD1. The solder bump BP in the second pad P2 may be biased to one side in a width direction, and in this case, when the biased distance in one direction along the width direction compared to the normal alignment exceeds the first distance (a) along the width direction, the integrated circuit chip 50 and the first driving pad portion PAD1 are misaligned, and thus the display device may be determined to be defective. Even if the solder bump BP in the second pad P2 is biased to one side, when the biased distance compared to the normal alignment is less than or equal to the first distance (a), it may be determined that the alignment of the integrated circuit chip 50 and the first driving pad portion PAD1 is correct or aligned. For example, the first distance (a) may be about 1 micrometer to about 10 micrometers. In this case, the position at which the solder bump BP is normally aligned refers to a case in which the solder bump BP is positioned to completely overlap the (2-1)-th pad P2-1 based on the (2-1)-th pad P2-1.

The (2-2)-th pad P2-2 may include a (2-2)-th line portion L2-2 and a (2-2)-th opening OP2-2. The (2-2)-th opening OP2-2 may have a parallelogram shape (as a polygonal shape) in a plan view, and the (2-2)-th line portion L2-2 may have a shape surrounding an edge of the parallelogram shape. An entirety of the (2-2)-th opening OP2-2 may correspond to an alignment area of the second pad P2. The (2-2)-th line portion L2-2 may define an enclosed shape and the planar shape of the (2-2)-th opening OP2-2. The (2-2)-th line portion L2-2 may correspond to the second pad P2 labeled in FIG. 3B, without being limited thereto. The solder bump BP may be disposed within the (2-2)-th opening OP2-2.

Figure 5:
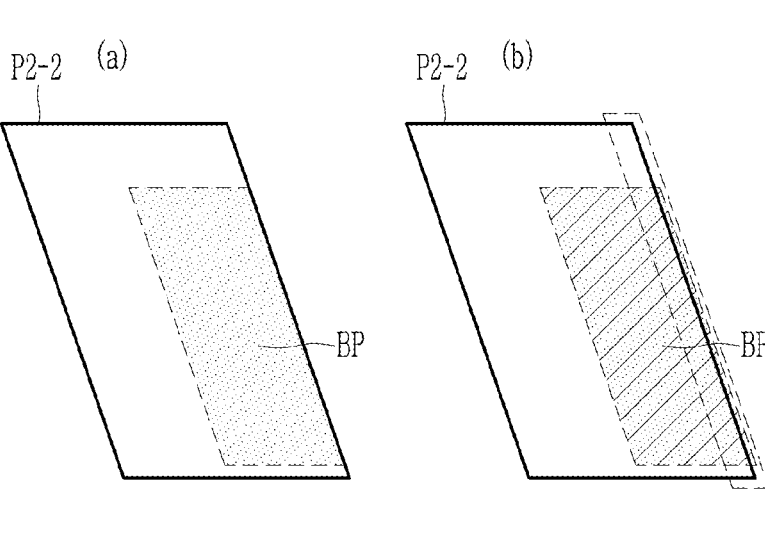
FIG. 5 illustrates a schematic view of a method which checks alignment between an integrated circuit chip and a pad portion.

Hereinafter, a method for confirming alignment or determining an alignment between the integrated circuit chip 50 and the first driving pad portion PAD1 will be described with reference to FIG. 5. FIG. 5 illustrates a schematic view of a method for confirming the alignment or determining an alignment between the integrated circuit chip 50 and the first driving pad portion PAD1.

Referring to FIG. 5(a), the solder bump BP may be disposed to be biased along the width direction, in the (2-2)-th pad P2-2. Since the width of the (2-2)-th pad P2-2 corresponds to a reference value for determining the alignment defect, when the solder bump BP is positioned in the (2-2)-th pad P2-2, the device is not determined to be defective even if the solder bump BP is biased to one side. That is, alignment is confirmed even if the solder bump BP is biased maximally to one side but an entirety thereof is within the (2-2)-th line portion L2-2 of the (2-2)-th pad P2-2.

In an embodiment, for example, the first driving pad portion PAD1 may include a first distance (a) corresponding to the width direction of the polygonal shape of the second pad P2, the first distance (a) being a reference value by which alignment between the first driving pad portion PAD1 and the integrated circuit chip 50 is determined. Along the width direction of the polygonal shape, the width of the (2-2)-th opening OP2-2 of the (2-2)-th pad P2-2 is a sum of the width of the solder bump BP of the integrated circuit chip 50 and twice the first distance (a). The solder bump BP of the integrated circuit chip 50 within the (2-2)-th opening OP2-2 of the (2-2)-th pad P2-2 and spaced apart from the (2-2)-th line portion L2-2 of the (2-2)-th pad P2-2 by a maximum distance which is less than or equal to twice the first distance (a) along the width direction of the polygonal shape determines alignment between the first driving pad portion PAD1 and the integrated circuit chip 50.

In contrast, FIG. 5(b) illustrates a case in which at least a portion of the solder bump BP is positioned outside the edge of the (2-2)-th pad P2-2, that is, outside of the (2-2)-th line portion L2-2 of the (2-2)-th pad P2-2. According to this, since the solder bumps BP are disposed at a position out of the reference value, the first driving pad portion PAD1 and the integrated circuit chip 50 may be misaligned and thus the device may be determined as defective (e.g., misaligned). In an embodiment, the solder bump BP of the integrated circuit chip 50 within the (2-2)-th opening OP2-2 of the (2-2)-th pad P2-2 and spaced apart from the (2-2)-th line portion L2-2 of the (2-2)-th pad P2-2 by a maximum distance which is more than twice the first distance (a) along the width direction of the polygonal shape (e.g., spaced apart from the left portion of the (2-2)-th line portion L2-2 of the (2-2)-th pad P2-2 by more than twice the first distance (a) and overlapping the right portion of the (2-2)-th line portion L2-2 of the (2-2)-th pad P2-2) determines misalignment between the first driving pad portion PAD1 and the integrated circuit chip 50.

Figure 6:
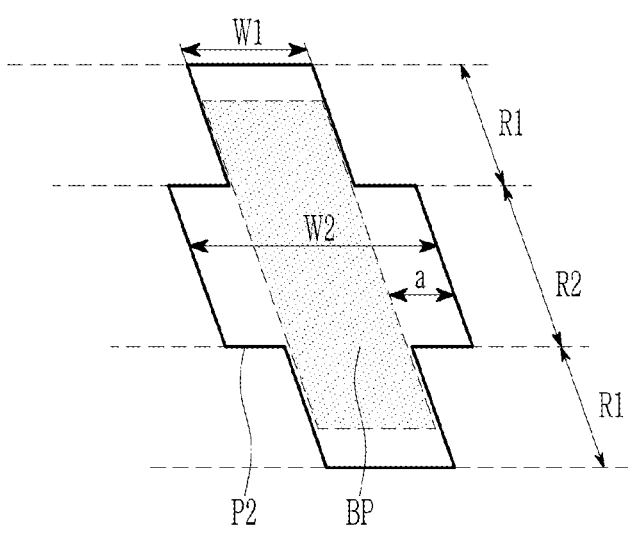
FIG. 6 illustrates a top plan view of a second pad according to an embodiment.

Hereinafter, the first driving pad portion PAD1 according to an embodiment will be described with reference to FIG. 6 and FIGS. 7(a) and (b). FIG. 6 illustrates a top plan view of the second pad P2 according to an embodiment, and FIGS. 7(a) and (b) illustrates a schematic view of a method for confirming the alignment or determining an alignment between the integrated circuit chip 50 and the first driving pad portion PAD1.

First, referring to FIG. 6, the second pad P2 according to an embodiment may include a first area R1 having a first width W1 and a second area R2 having a second width W2. The second pad P2 includes a line portion (dark line in FIG. 6) which defines an opening within the line portion at the first area R1 and the second area R2, the opening of the second pad P2 at the first area R1 defining the width of the first area R1 (e.g., the first width W1) and the opening of the second pad P2 at the second area R2 defining the width of the second area R2 (e.g., the second width W2).

The first width W1 may be smaller than the second width W2. The first width W1 may be a minimum width of the second pad P2. The first width W1 virtually extended along a length of the second pad P2 (e.g., the length extended along the second direction DR2) may effectively define a parallelogram shape (as a polygonal shape) within the second pad P2. The first width W1 of the second pad P2 is defined along a width direction of the polygonal shape. The first width W1 virtually extended along the length of the second pad P2 may correspond to an alignment area of the second pad P2. The alignment area may be defined by a product of the first width W1 and a length within the second pad P2, without being limited thereto. For example, the first width W1 may be the same as the width of the solder bump BP (or of the chip pad ICP of the integrated circuit chip 50). When the solder bump BP is located in the first area R1, it can be seen that the integrated circuit chip 50 and the first driving pad portion PAD1 are in a normal alignment state (e.g., within the alignment area).

The second width W2 may be a sum of the width of the solder bump BP and twice the first distance (a). The first distance (a) may be a value for determining misalignment between the integrated circuit chip 50 and the first driving pad portion PAD1. Along the width direction (e.g., the first direction DR1, the first driving pad portion PAD1 further includes a first distance (a) as a reference value by which alignment between the first driving pad portion PAD1 and the integrated circuit chip 50 is determined, and the opening of the second pad P2 has a width at the second area R2 which is a sum of the width of the solder bump BP of the integrated circuit chip 50 and twice the first distance (a).

The solder bump BP in the second pad P2 may be biased to one side, and in this case, when the biased distance compared to the normal alignment exceeds the first distance (a), the integrated circuit chip 50 and the first driving pad portion PAD1 is misaligned, and thus the display device may be determined to be defective. Even if the solder bump BP in the second pad P2 is biased to one side, when the biased distance compared to the normal alignment is less than or equal to the first distance (a), it may be determined that the alignment of the integrated circuit chip 50 and the first driving pad portion PAD1 is correct. For example, the first distance (a) may be about 1 micrometer to about 10 micrometers.

In some embodiments, within the second pad P2, the first area R1, the second area R2, and the first area R1 may be sequentially disposed along the second direction DR2, but is not limited thereto.

Figure 7:
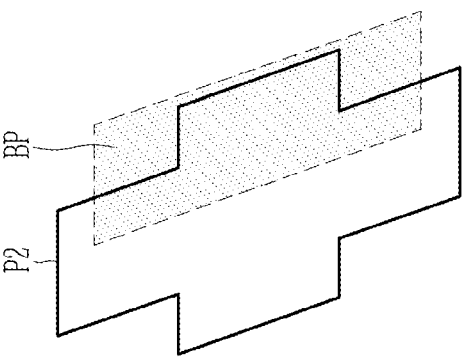
FIGS. 7(*a*) and (*b*) illustrates a schematic view of a method which checks alignment between an integrated circuit chip and a pad portion.
Figure 7:
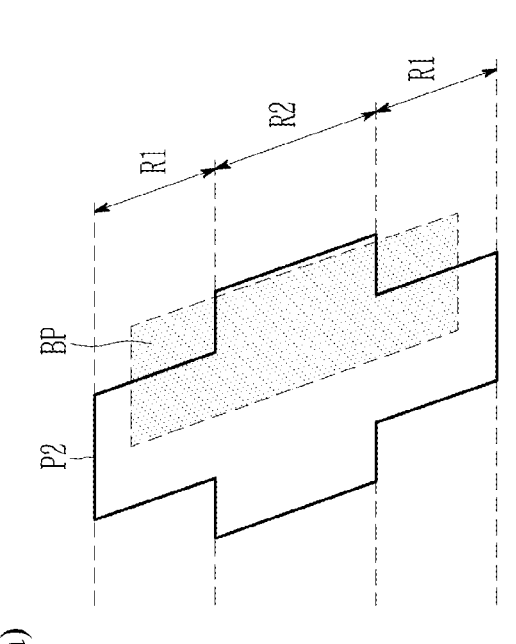
Figure 7:
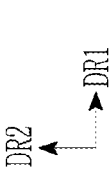

Referring to FIG. 7(a), in a process of attaching the integrated circuit chip 50 and the first driving pad portion PAD1 according to an embodiment, the solder bumps BP may be biased and attached to one side of the second pad P2. In this case, the solder bumps BP may be disposed in the second area R2 of the second pad P2, and the solder bumps BP may not be in a normally-aligned state, which may not correspond to a device defect since the biased distance compared to the normal alignment is less than or equal to the first distance (a). In an embodiment, referring to FIGS. 6 and 7(a), along the width direction, the solder bump BP of the integrated circuit chip 50 within the line portion at the second area R2 determines alignment between the first driving pad portion PAD1 and the integrated circuit chip 50.

Referring to FIG. 7(b), in the process of attaching the integrated circuit chip 50 and the first driving pad portion PAD1 according to the embodiment, the solder bumps BP may be biased and attached to one side of the second pad P2. Particularly, when at least a portion of the solder bump BP is positioned outside the second pad P2 as shown in FIG. 7(b), the integrated circuit chip 50 and the first driving pad portion PAD1 are in a misaligned state since the biased distance compared to the normal alignment exceeds the first distance (a), so the device defect may be easily determined.

That is, referring to FIG. 6 and FIGS. 7(a) and (b), it is possible to confirm whether the first driving pad portion PAD1 and the integrated circuit chip 50 are normally aligned according to the position of the solder bump BP in the first area R1, it is possible to confirm whether there is a defect due to misalignment between the first driving pad portion PAD1 and the integrated circuit chip 50 according to the position of the solder bump BP while in or outside of the second area R2.

Figure 8:
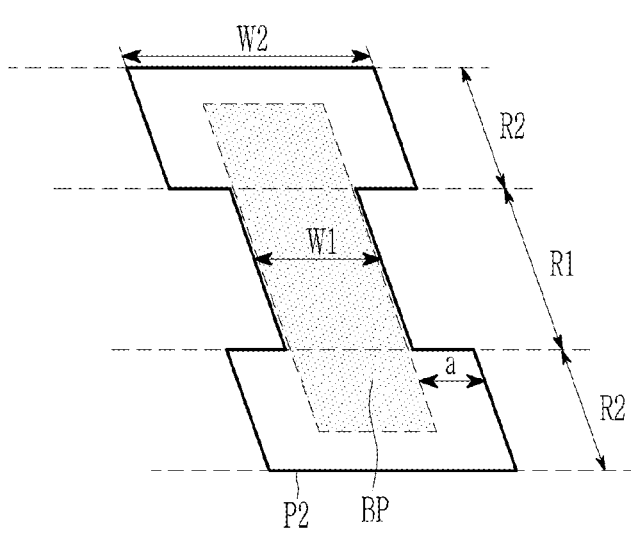
FIG. 8 and FIG. 9 respectively illustrate a top plan view of a second pad portion according to an embodiment.
Figure 9:
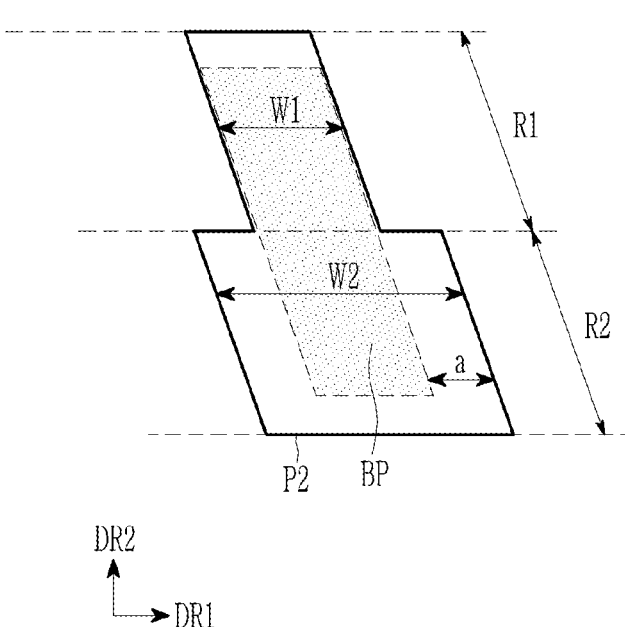

Hereinafter, the second pad P2 according to an embodiment will be described with reference to FIG. 8 and FIG. 9. FIG. 8 and FIG. 9 respectively illustrate a top plan view of the second pad P2 according to an embodiment. A description of the same constituent elements as those described above will be omitted.

Referring to FIG. 8, the second pad P2 according to an embodiment may include a first area R1 having a first width W1 and a second area R2 having a second width W2. The first width W1 may be smaller than the second width W2. For example, the first width W1 may be the same as the width of the solder bump BP. The second width W2 may be a sum of the width of the solder bump BP and twice the first distance (a). The first distance (a) may be a value for determining misalignment between the integrated circuit chip 50 and the first driving pad portion PAD1.

In some embodiments, within the second pad P2, the second area R2, the first area R1, and the second area R2 may be sequentially disposed along the second direction DR2, but is not limited thereto.

Referring to FIG. 9, the second pad P2 according to an embodiment may include a first area R1 having a first width W1 and a second area R2 having a second width W2. The first width W1 may be smaller than the second width W2. For example, the first width W1 may be the same as the width of the solder bump BP. The second width W2 may be a sum of the width of the solder bump BP and twice the first distance (a). The first distance (a) may be a value for determining misalignment between the integrated circuit chip 50 and the first driving pad portion PAD1.

In some embodiments, within the second pad P2, one first area R1 and one second area R2 may be sequentially disposed along the second direction DR2, but is not limited thereto.

That is, in both the embodiments of FIG. 8 and FIG. 9, it is possible to confirm whether the first driving pad portion PAD1 and the integrated circuit chip 50 are normally aligned according to the position of the solder bump BP in the first area R1, while it is possible to confirm whether there is a defect due to misalignment between the first driving pad portion PAD1 and the integrated circuit chip 50 according to the position of the solder bump BP in the second area R2.

Hereinafter, the first driving pad portion PAD1 according to an embodiment will be described with reference to FIG. 10 to FIG. 15. FIG. 10, FIGS. 11(a) to 11(d), FIG. 12, FIGS. 13(a) to 13(d), FIG. 14, and FIG. 15 respectively illustrate a top plan view of the first driving pad portion according to an embodiment.

Figure 10:
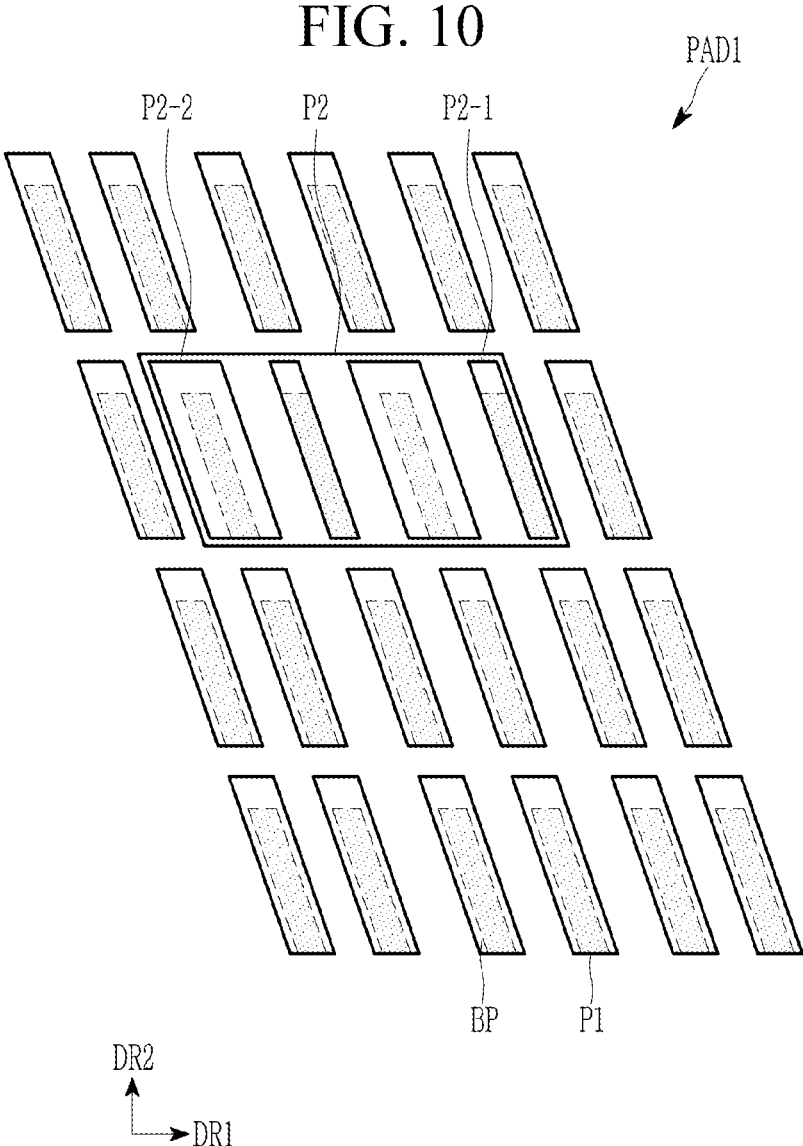
FIG. 10, FIGS. 11(*a*) to 11(*d*), FIG. 12, FIGS. 13(*a*) to 13(*d*), FIG. 14, and FIG. 15 respectively illustrate a top plan view of a first driving pad portion according to an embodiment.
Figure 11:
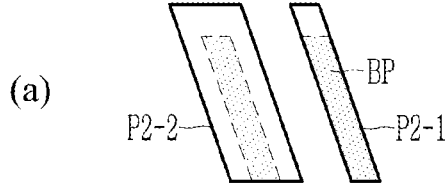
Figure 11:
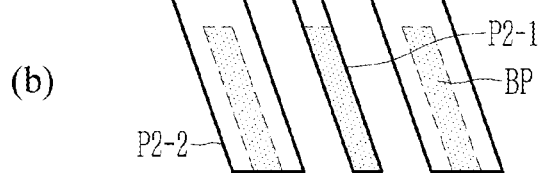
Figure 11:
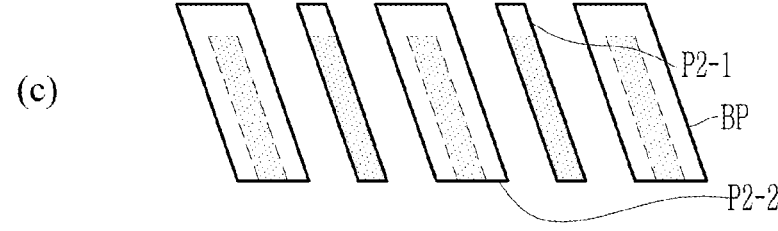
Figure 11:
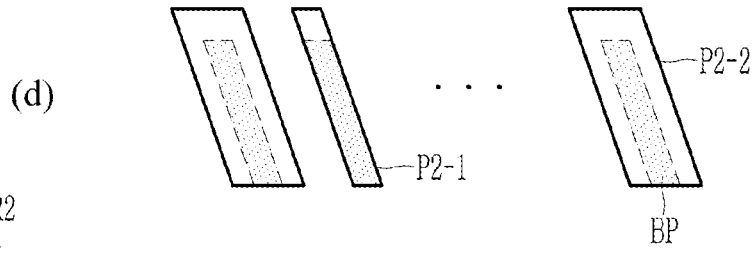

First, referring to FIG. 10, the first driving pad portion PAD1 according to the embodiment may include at least one or more first pads P1, and at least one or more second pads P2. A plurality of the first pads P1 may be repeatedly disposed along the first direction DR1 and the second direction DR2. The second pad P2 may be disposed between the plurality of the first pads P1. The first pads P1 may surround upper, lower, left, and right portions of the second pad P2.

The second pad P2 according to the embodiment may be disposed extended along the first direction DR1, to have a major dimension along the first direction DR1 and a minor dimension along the second direction DR2. The pad patterns within each of the plurality of the second pads P2 in the first driving pad portion PAD1 may be disposed arranged along the first direction DR1. In the present specification, the embodiment in which the plurality of pad patterns in each of the second pads P2 are disposed in one row is illustrated, but the invention is not limited thereto.

The second pad P2 may include at least one or more (2-1)-th pads P2-1 (e.g., one or more of a first pad pattern), and at least one or more (2-2)-th pads P2-2 (e.g., one or more of a second pad pattern). According to the embodiment, the (2-2)-th pad P2-2 and the (2-1)-th pad P2-1 may be alternately disposed along the first direction DR1, within a same one of the second pad P2. In the present specification, the embodiment in which the (2-2)-th pad P2-2 and the (2-1)-th pad P2-1 are sequentially repeatedly disposed is illustrated, but the invention is not limited thereto, and the (2-1)-th pad P2-1 and the (2-2)-th pad P2-2 may be sequentially repeatedly disposed.

Next, the second pad P2 of FIG. 10 may be modified as shown in FIGS. 11(a) through 11(d). As shown in FIG. 11(a), the second pad P2 of FIG. 10 includes one (2-2)-th pad P2-2 and one (2-1)-th pad P2-1, or as shown in FIG. 11(b), the second pad P2 of FIG. 10 may has a structure in which one (2-1)-th pad P2-1 is disposed between the two (2-2)-th pads P2-2. Alternatively, as shown in FIG. 11(c), the second pad P2 of FIG. 10 may include three (2-2)-th pads P2-2 (e.g., a plurality of second pad patterns) and two (2-1)-th pads P2-1 (e.g., a plurality of first pad patterns), and the second pad P2 of FIG. 10 may have a structure in which the (2-1)-th pad P2-1 may be disposed between adjacent (2-2)-th pads P2-2. Alternatively, as shown in FIG. 11(d), the second pad P2 of FIG. 10 may include 'n' (where 'n' is a natural number) (2-2)-th pads P2-2 and (n-1) (2-1)-th pads P2-1, and the second pad P2 of FIG. 10 may have a structure in which the (2-1)-th pad P2-1 may be disposed between adjacent (2-2)-th pads P2-2. The (2-2)-th pad P2-2 may be an outermost pad pattern within the second pad P2 of FIG. 10, without being limited thereto.

Figure 12:
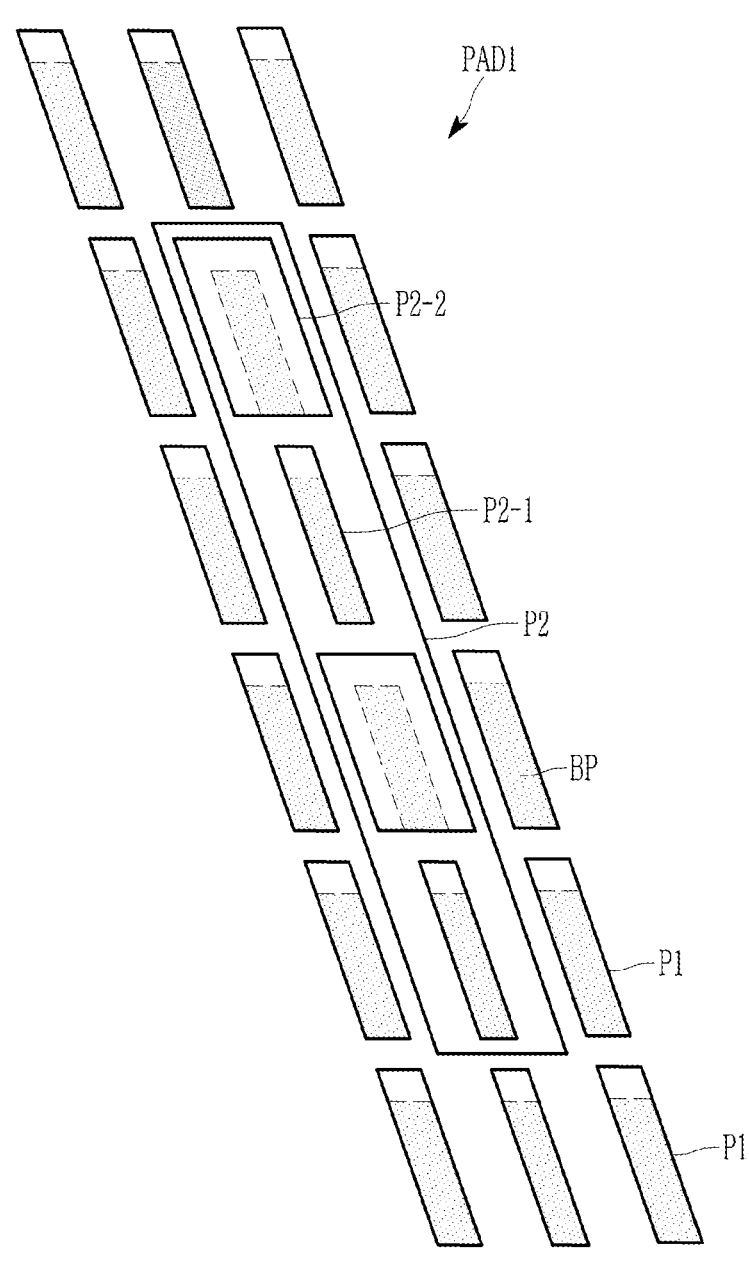
Figure 12:
Figure 13:
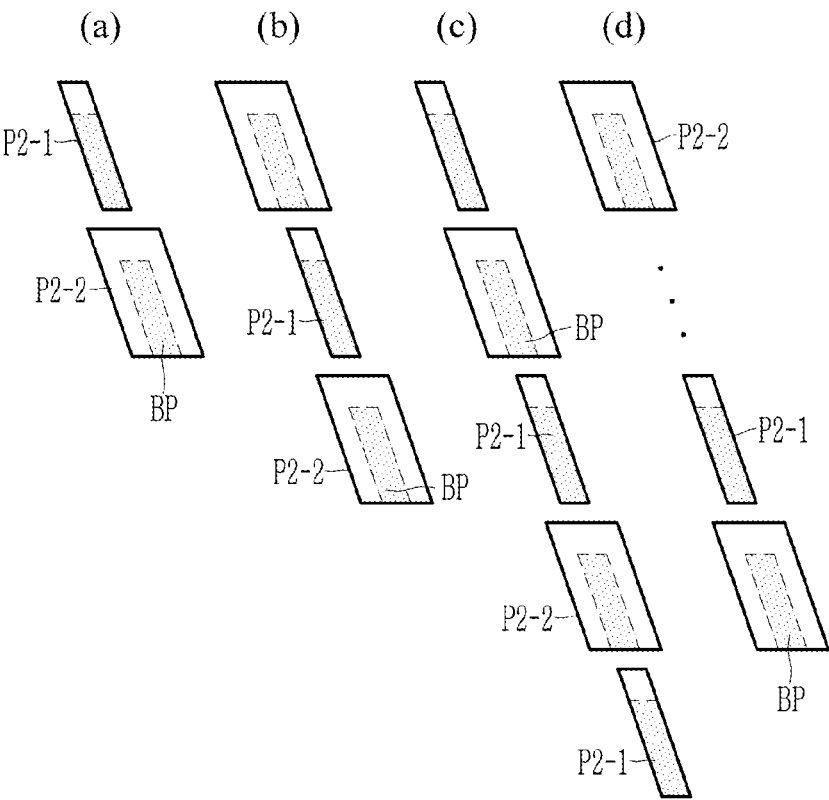
Figure 13:

Next, referring to FIG. 12, the first driving pad portion PAD1 according to the embodiment may include at least one or more first pads P1, and at least one or more second pads P2. A plurality of the first pads P1 may be repeatedly disposed along the first direction DR1 and the second direction DR2. The second pad P2 may be disposed between the plurality of the first pads P1. The first pad P1 may surround upper, lower, left, and right portions of the second pad P2.

The second pad P2 according to the embodiment may be disposed extended along the second direction DR2, to have a major dimension along the second direction DR2 (e.g., a length) and a minor dimension along the first direction DR1 (e.g., a width). The pad patterns within each of the plurality of the second pads P2 in the first driving pad portion PAD1 may be disposed arranged along the second direction DR2. In the present specification, the embodiment in which the plurality of pad patterns in each of the second pads P2 are disposed in one column is illustrated, but the invention is not limited thereto.

The second pad P2 may include at least one or more (2-1)-th pads P2-1 (e.g., one or more of a first pad pattern), and at least one or more (2-2)-th pads P2-2 (e.g., one or more of a second pad pattern). According to the embodiment, the (2-2)-th pad P2-2 and the (2-1)-th pad P2-1 may be alternately disposed along the second direction DR2, within a same one of the second pad P2. In the present specification, the embodiment in which the (2-2)-th pad P2-2 and the (2-1)-th pad P2-1 are sequentially repeatedly disposed is illustrated, but the invention is not limited thereto, and the (2-1)-th pad P2-1 and the (2-2)-th pad P2-2 may be sequentially repeatedly disposed.

Next, the second pad P2 of FIG. 12 may be modified as shown in FIGS. 13(a) to 13(d). The second pad P2 of FIG. 12 may include one (2-2)-th pad P2-2 and one (2-1)-th pad P2-1 disposed along the second direction DR2 as shown in FIG. 13(a), or the second pad P2 of FIG. 12 may include two (2-2)-th pads P2-2 and one (2-1)-th pad P2-1 disposed therebetween that are disposed along the second direction DR2 as shown in FIG. 13(b). Alternatively, as shown in FIG. 13(c), the second pad P2 of FIG. 12 may include three (2-1)-th pads P2-1 and two (2-2)-th pads P2-2, and the second pad P2 of FIG. 12 may have a structure in which the (2-1)-th pad P2-1 may be disposed between adjacent (2-2)-th pads P2-2 along the second direction DR2. Alternatively, as shown in FIG. 13(d), the second pad P2 of FIG. 12 may include 'n' (where 'n' is a natural number) (2-2)-th pads P2-2 and (n-1) (2-1)-th pads P2-1, and the second pad P2 of FIG. 12 may have a structure in which the (2-1)-th pad P2-1 may be disposed between adjacent (2-2)-th pads P2-2 along the second direction DR2.

Figure 14:
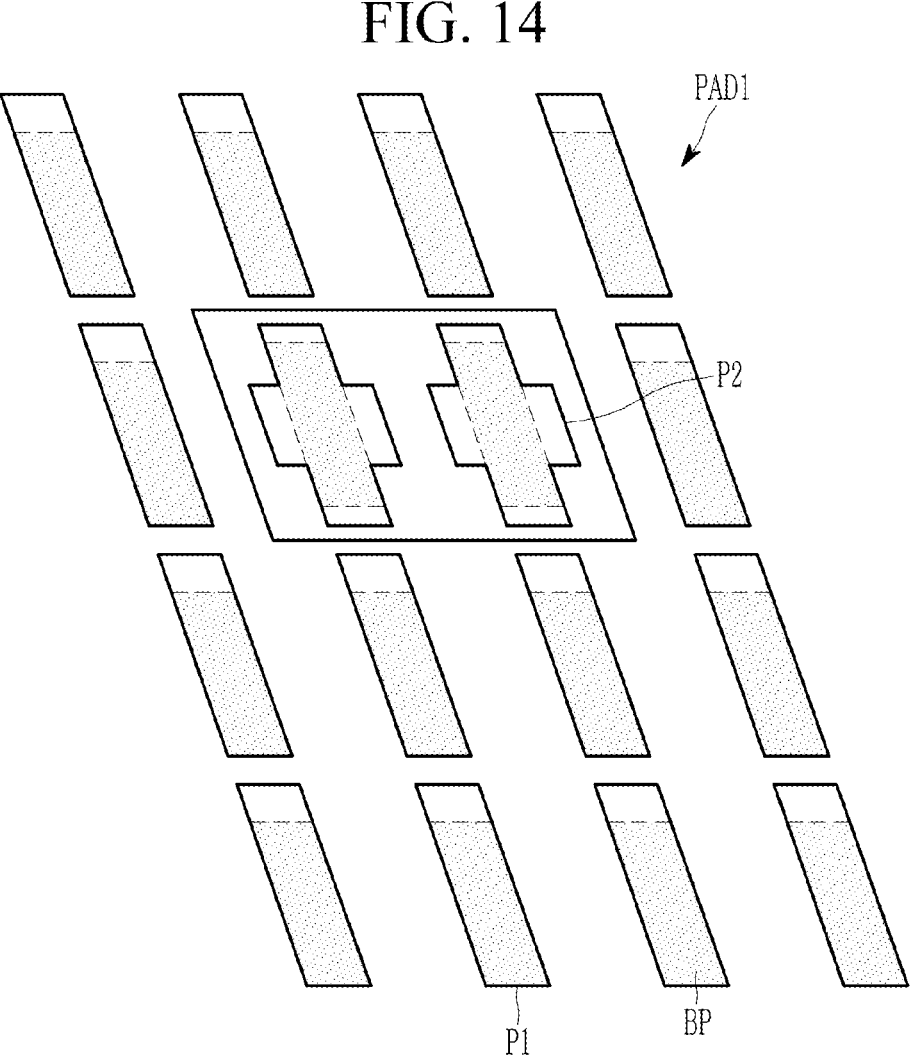
Figure 14:

Next, referring to FIG. 14, the first driving pad portion PAD1 according to the embodiment may include at least one or more first pads P1, and at least one or more second pads P2. A plurality of the first pads P1 may be repeatedly disposed along the first direction DR1 and the second direction DR2. The second pad P2 may be disposed between the plurality of the first pads P1. The first pad P1 may surround upper, lower, left, and right portions of the second pad P2.

The second pad P2 according to the embodiment may have the shape according to the embodiment of FIG. 6. However, the shape is not limited thereto, and may have the shape according to the embodiment of FIG. 8 or FIG. 9, or may include a combination thereof.

In addition, the second pad P2 may be provided in plural to define a group of the second pads P2 including more than one of the second pads P2. Referring to FIG. 14, according to the embodiment, the group of second pads P2 (labeled as "P2" in FIG. 14) has been illustrated extended along the first direction DR1 while including two of the second pads P2, but is not limited thereto, and the number and disposition of the second pads P2 within a same group may be variously changed.

Figure 15:
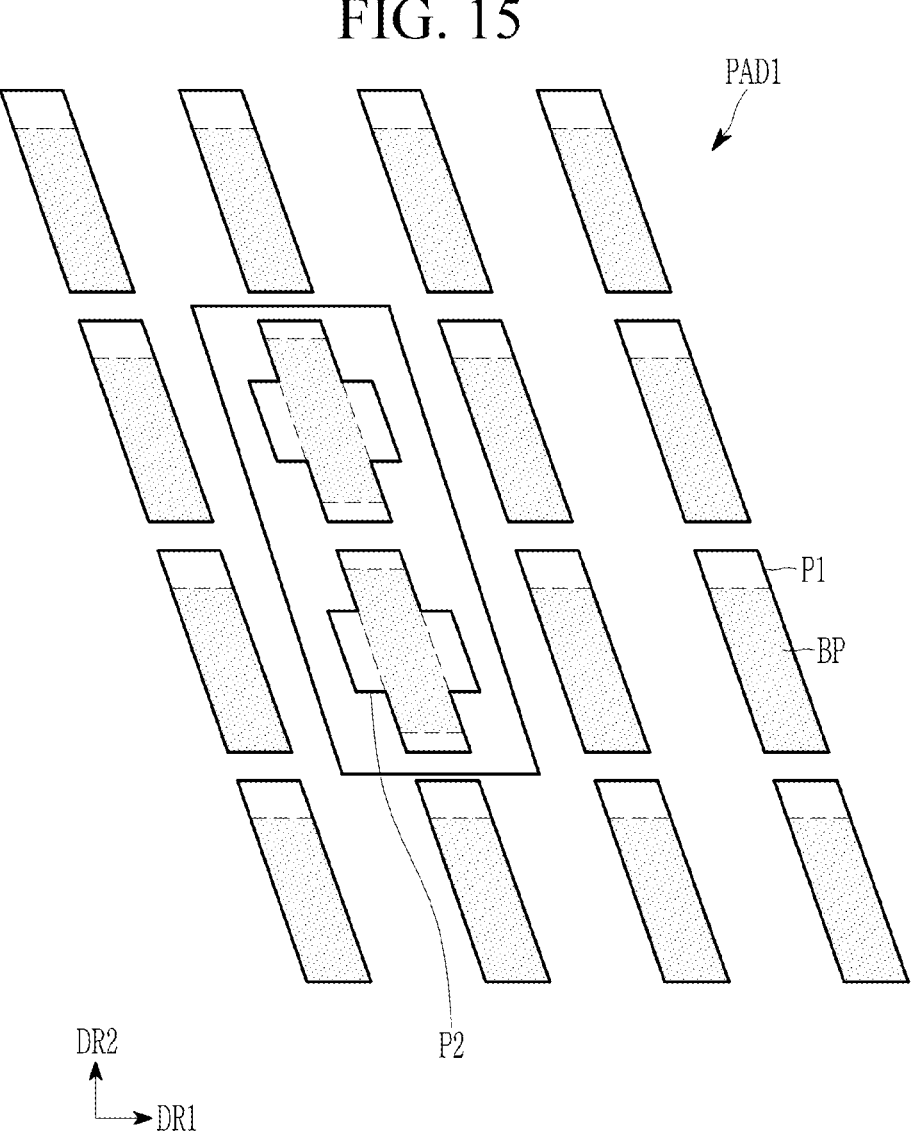

Next, referring to FIG. 15, the first driving pad portion PAD1 according to the embodiment may include at least one or more first pads P1, and at least one or more second pads P2. A plurality of the first pads P1 may be repeatedly disposed along the first direction DR1 and the second direction DR2. The second pad P2 may be disposed between the plurality of the first pads P1. The first pad P1 may surround upper, lower, left, and right portions of the second pad P2.

The second pad P2 according to the embodiment may have the shape according to the embodiment of FIG. 6. However, the shape is not limited thereto, and may have the shape according to the embodiment of FIG. 8 or FIG. 9, or may include a combination thereof.

In addition, the second pad P2 may be provided in plural to define a group of the second pads P2 including more than one of the second pads P2. Referring to FIG. 15, according to the embodiment, the group of second pads P2 (labeled as "P2" in FIG. 15) has been illustrated extended along the second direction DR2 while including two of the second pads P2, but is not limited thereto, and the number and disposition of the second pads P2 within a same group may be variously changed.

According to one or more embodiment, since the solder bump BP deviating from the second pad P2 means the misalignment between the display panel DP and the integrated circuit chip 50, a defect in the device may be checked without separate measurement. It is possible to provide a display device 1000 with a simplified manufacturing process.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel including:
  a display area, and
  a non-display area including a first driving pad portion at which the display panel is connected to an integrated circuit chip by solder bumps of the integrated circuit chip, each of the solder bumps having a width,
  wherein
  the first driving pad portion includes:
    a first pad through which an electrical signal transmits between the first driving pad portion and the integrated circuit chip via a solder bump among the solder bumps;
    a second pad which is electrically floating and by which alignment between the first driving pad portion and the integrated circuit chip is determined; and
    the second pad of the first driving pad portion including:

a (2-1)-th pad having a width which is the same as the width of the solder bump; and
      a (2-2)-th pad having a width which is larger than the width of the (2-1)-th pad; and
  the first pad, the (2-1)-th pad and the 2-2)-th pad respectively corresponding to the solder bumps of the integrated circuit.

2. The display device of claim 1, wherein within the second pad of the display panel:
the (2-1)-th pad includes a (2-1)-th line portion including portions spaced apart from each other which define a (2-1)-th opening of the (2-1)-th pad the (2-1)-th opening being an enclosed opening having a polygonal shape, and
the (2-2)-th pad includes a (2-2)-th line portion including portions spaced apart from each other which define a (2-2)-th opening of the (2-2)-th pad, the (2-2)-th opening being an enclosed opening having the polygonal shape.

3. The display device of claim 2, wherein
the (2-1)-th opening of the (2-1)-th pad has a width between the portions of the (2-1)-th line portion which are spaced apart from each other in a width direction of the polygonal shape, and
along the width direction of the polygonal shape, the width of the of the (2-1)-th opening of the (2-1)-th pad and the width of the solder bump of the integrated circuit chip are the same-.

4. The display device of claim 3, wherein
the (2-2)-th opening of the (2-2)-th pad has a width between the portions of the (2-2)-th line portion which are spaced apart from each other in the width direction of the polygonal shape, and
along the width direction of the polygonal shape, the width of the (2-2)-th opening of the (2-2)-th pad is larger than the width of the solder bump.

5. The display device of claim 4, wherein
the first driving pad portion further includes a first distance corresponding to the width direction of the polygonal shape, the first distance being a reference value by which the alignment between the first driving pad portion and the integrated circuit chip is determined,
along the width direction of the polygonal shape, the width of the (2-2)-th opening of the (2-2)-th pad is a sum of the width of the solder bump of the integrated circuit chip and twice the first distance, and
the solder bump of the integrated circuit chip within the (2-2)-th opening of the (2-2)-th pad and spaced apart from the (2-2)-th line portion of the (2-2)-th pad by a maximum distance along the width direction of the polygonal shape which is:
  less than or equal to twice the first distance, determines alignment between the first driving pad portion and the integrated circuit chip, and
  by more than twice the first distance, determines misalignment between the first driving pad portion and the integrated circuit chip.

6. The display device of claim 1, wherein the solder bump of the integrated circuit chip which completely overlaps the (2-2)-th pad portion determines alignment between the first driving pad portion and the integrated circuit chip.

7. The display device of claim 1, wherein within the first driving pad portion:

the second pad has a polygonal shape defining a minor dimension along a first direction, and a major dimension along a second direction crossing the first direction, the second pad is provided in plural including a plurality of the second pads arranged along the first direction, and the plurality of the second pads includes the (2-1)-th pad and the (2-2)-th pad adjacent along the first direction.

8. The display device of claim 7, wherein the plurality of the second pads includes:

each of the (2-1)-th pad and the (2-2)-th pad provided in plural, and n of the (2-2)-th pads and (n-1) of the (2-1)-th pads arranged alternating along the first direction.

9. The display device of claim 1, wherein within the first driving pad portion:

the second pad has a polygonal shape defining a minor dimension along a first direction, and a major dimension along a second direction crossing the first direction, the second pad is provided in plural including a plurality of the second pads arranged along the second direction, and the (2-1)-th pad and the (2-2)-th pad are alternately disposed.

10. The display device of claim 9, wherein the plurality of the second pads includes:

each of the (2-1)-th pad and the (2-2)-th pad provided in plural, and n pieces of the (2-2)-th pads and (n-1) pieces of the (2-1)-th pads arranged alternating along the second direction.

11. A display device comprising:

a display panel including:

a display area, and a non-display area including a first driving pad portion at which the display panel is connected to an integrated circuit chip by solder bumps of the integrated circuit chip, each of the solder bumps having a width defining a width direction, wherein the first driving pad portion includes:

a first pad through which an electrical signal transmits between the first driving pad portion and the integrated circuit chip via a solder bump among the solder bumps;

a second pad which is electrically floating and by which alignment between the first driving pad portion and the integrated circuit chip is determined; and the second pad of the first driving pad portion including:

a first area having a width along the width direction which is the same as the width of the solder bump; and a second area extending from the first area in a direction crossing the width direction, the second area having a width along the width direction which is larger than the width of the first area; and the first pad and the second pad respectively corresponding to the solder bumps of the integrated circuit.

12. The display device of claim 11, wherein the second pad further includes:

the first area provided in plural including two first areas, and one of the second area between the two first areas along the direction crossing the width direction.

13. The display device of claim 11, wherein along the width direction, the width of the first area of the second pad and the width of the solder bump of the integrated circuit chip are the same.

14. The display device of claim 11, wherein along the width direction, the width of the second area of the second pad is larger than the width of the solder bump of the integrated circuit chip.

15. The display device of claim 11, wherein the second pad includes a line portion including portions spaced apart from each other which define an opening at the first area and the second area the opening being enclosed by the line portion, the opening of the second pad at the first area defines the width of the first area and the opening of the second pad at the second area defines the width of the second area, and along the width direction:

the first driving pad portion further includes a first distance as a reference value by which the alignment between the first driving pad portion and the integrated circuit chip is determined, and the width at the second area is a sum of the width of the solder bump of the integrated circuit chip and twice the first distance.

16. The display device of claim 11, wherein the second pad includes a line portion including portions spaced apart from each other which define an opening at the first area and the second area, the opening being enclosed by the line portion, the opening of the second pad at the first area defines the width of the first area and the opening of the second pad at the second area defines the width of the second area, and along the width direction, the solder bump of the integrated circuit chip within the line portion at the second area determines alignment between the first driving pad portion and the integrated circuit chip.

17. The display device of claim 11, wherein the second pad further includes:

the second area provided in plural including two second areas, and one of the first area between the two second areas.

18. The display device of claim 11, wherein the second pad further includes:

one of the second area and one of the first area.

19. The display device of claim 11, wherein the second pad is providing in plural along a first direction or along a second direction which crosses the first direction.

20. The display device of claim 11, wherein each of the first pad and the second pad has a planar shape of a rectangle or a parallelogram, and the planar shape defines a minor dimension along the width direction of the solder bump to define a first direction, and a major direction along a second direction crossing the first direction.

* * * * *